(12) United States Patent
Gupta et al.

(10) Patent No.: US 12,431,909 B2
(45) Date of Patent: Sep. 30, 2025

(54) SSD WITH REFERENCE CLOCK LOSS TOLERANT OSCILLATOR

(71) Applicant: Western Digital Technologies, Inc., San Jose, CA (US)

(72) Inventors: Nitin Gupta, Uttar Pradesh (IN); Pikul Sarkar, Karnataka (IN); Bhavin Odedara, Karnataka (IN)

(73) Assignee: Sandisk Technologies, Inc., Milpitas, CA (US)

( * ) Notice: Subject to any disclaimer, the term of this patent is extended or adjusted under 35 U.S.C. 154(b) by 111 days.

(21) Appl. No.: 18/349,906

(22) Filed: Jul. 10, 2023

(65) Prior Publication Data

US 2024/0201848 A1 Jun. 20, 2024

Related U.S. Application Data

(60) Provisional application No. 63/387,622, filed on Dec. 15, 2022.

(51) Int. Cl.
| | |
|---|---|
| *G06F 3/06* | (2006.01) |
| *G11C 16/32* | (2006.01) |
| *H03L 7/099* | (2006.01) |

(52) U.S. Cl.
CPC ............. *H03L 7/099* (2013.01); *G11C 16/32* (2013.01)

(58) Field of Classification Search
CPC ..... G06F 3/0604; G06F 3/0655; G06F 3/0679
See application file for complete search history.

(56) References Cited

U.S. PATENT DOCUMENTS

| | | | |
|---|---|---|---|
| 6,356,127 B1 | 3/2002 | Klipper et al. | |
| 8,446,193 B2 | 5/2013 | Zhang et al. | |
| 9,311,231 B2 | 4/2016 | Chen | |
| 9,438,164 B2 | 9/2016 | Pancholi et al. | |
| 10,601,575 B1 * | 3/2020 | Guo | H04L 7/0004 |
| 10,627,851 B2 | 4/2020 | Chen et al. | |
| 10,631,248 B2 * | 4/2020 | Seshadri | G06F 9/30021 |
| 10,727,841 B2 | 7/2020 | Ghotgalkar | |
| 2022/0103181 A1 * | 3/2022 | Ghotgalkar | H03L 7/099 |
| 2024/0029779 A1 * | 1/2024 | Kuzmenka | H03K 3/0315 |

\* cited by examiner

*Primary Examiner* — Raymond N Phan
(74) *Attorney, Agent, or Firm* — ARENTFOX SCHIFF LLP

(57) ABSTRACT

Aspects of a storage device are provided for producing an oscillator clock from a host reference clock in a storage device lacking a crystal oscillator. The storage device includes a memory die, and an oscillator circuit that generates a clock based on a host reference clock and outputs an output clock to the memory die. While the host reference clock is available, the output clock includes a frequency that is identical to a frequency or a frequency division factor of the host reference clock. In response to loss of the host reference clock, the oscillator circuit reduces the frequency of the output clock to a frequency of the generated clock within a clock cycle following the loss of the host reference clock. In response to re-availability of the host reference clock, the oscillator circuit increases the frequency of the output clock back to the frequency of the host reference clock.

19 Claims, 10 Drawing Sheets

SSD WITH REFERENCE CLOCK LOSS TOLERANT OSCILLATOR

CROSS REFERENCE TO RELATED APPLICATION(S)

This application claims the benefit of U.S. Provisional Application No. 63/387,622, entitled "SSD WITH REFERENCE CLOCK LOSS TOLERANT OSCILLATOR" and filed on Dec. 15, 2022, the disclosure of which is expressly incorporated by reference herein in its entirety.

BACKGROUND

Field

This disclosure is generally related to electronic devices and more particularly to storage devices.

Introduction

Storage devices enable users to store and retrieve data. Examples of storage devices include non-volatile memory devices. A non-volatile memory generally retains data after a power cycle. An example of a non-volatile memory is a flash memory, which may include array(s) of NAND cells on one or more dies. Flash memory may be found in solid-state devices (SSDs), Secure Digital (SD) cards, and the like.

One example of a storage device is an SSD. An SSD includes a printed circuit board (PCB) including multiple chipsets. These chipsets may include, for example, memory chips for data storage, an application specific integrated circuit (ASIC) or memory controller, a peripheral chipset such as a power management integrated circuit (PMIC), one or more sensors (e.g., temperature sensors, etc.), and a crystal oscillator. The crystal oscillator may provide a clock signal to the various chipsets of the SSD to activate their respective functions. However, such crystal oscillators may incur significant costs, utilize significant space on the PCB, and provide routing constraints. Therefore, it would be helpful to eliminate such crystal oscillators from storage devices including SSDs.

SUMMARY

One aspect of a storage device is disclosed herein. The storage device includes a memory die and a controller including an oscillator circuit. The oscillator circuit is configured to generate a clock based on a host reference clock, and output an output clock to the memory die. While the host reference clock is available, the output clock includes a frequency that is identical to a frequency or a division factor of the frequency of the host reference clock. In response to loss of the host reference clock, the oscillator circuit is configured to reduce the frequency of the output clock to a frequency of the generated clock within a generated clock cycle following the loss of the host reference clock.

Another aspect of a storage device is disclosed herein. The storage device includes a memory die and an oscillator circuit. The oscillator circuit is configured to generate a clock based on a host reference clock, and output an output clock to the memory die. While the host reference clock is available, a positive edge of the output clock is aligned in time with a positive edge of the host reference clock and a negative edge of the output clock is aligned in time with a negative edge of the generated clock during a respective clock cycle of the host reference clock. In response to loss of the host reference clock, a positive edge of the output clock is aligned in time with a positive edge of the generated clock within a generated clock cycle following the loss.

A further aspect of a storage device is disclosed herein. The storage device includes a memory die and an oscillator circuit. The oscillator circuit is configured to generate a clock based on a host reference clock, and output an output clock to the memory die. While the host reference clock is available, the oscillator circuit is configured to output the output clock at a frequency that is identical to a frequency of the host reference clock or a division factor of the frequency of the host reference clock. In response to loss of the host reference clock, the oscillator circuit is configured to reduce the frequency of the output clock to a frequency of the generated clock within a generated clock cycle following the loss. In response to re-availability of the host reference clock, the oscillator circuit is configured to increase the frequency of the output clock back to the frequency of the host reference clock within a plurality of host reference clock cycles following the re-availability.

It is understood that other aspects of the storage device will become readily apparent to those skilled in the art from the following detailed description, wherein various aspects of apparatuses and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of the present invention will now be presented in the detailed description by way of example, and not by way of limitation, with reference to the accompanying drawings, wherein.

DETAILED DESCRIPTION

Figure 1:
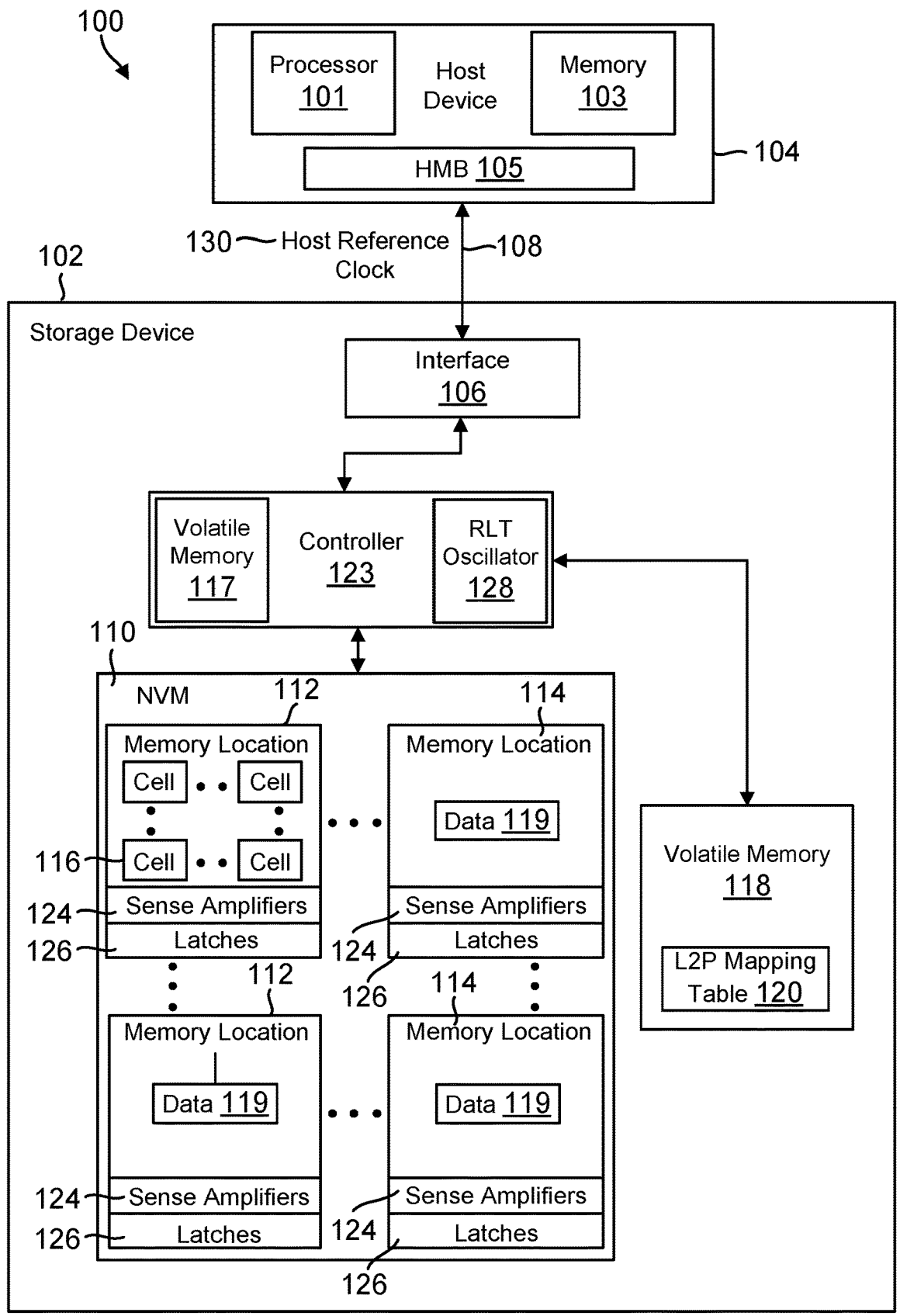
FIG. 1 is a block diagram illustrating an exemplary embodiment of a storage device in communication with a host device.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

The words "exemplary" and "example" are used herein to mean serving as an example, instance, or illustration. Any exemplary embodiment described herein as "exemplary" is not necessarily to be construed as preferred or advantageous over other exemplary embodiments. Likewise, the term "exemplary embodiment" of an apparatus, method or article of manufacture does not require that all exemplary embodiments of the invention include the described components, structure, features, functionality, processes, advantages, benefits, or modes of operation.

As used herein, the term "coupled" is used to indicate either a direct connection between two components or, where appropriate, an indirect connection to one another through intervening or intermediate components. In contrast, when a component referred to as being "directly coupled" to another component, there are no intervening elements present.

In the following detailed description, various aspects of a storage device in communication with a host device will be presented. These aspects are well suited for flash storage devices, such as SSDs and SD cards. However, those skilled in the art will realize that these aspects may be extended to all types of storage devices capable of storing data. Accordingly, any reference to a specific apparatus or method is intended only to illustrate the various aspects of the present invention, with the understanding that such aspects may have a wide range of applications without departing from the spirit and scope of the present disclosure.

Generally, a storage device includes a PCB having a crystal oscillator. However, crystal oscillators utilize significant space, result in routing constraints on the PCB, and incur significant costs. Therefore, storage device manufacturers have lately been seeking to remove the crystal oscillator from the storage device and instead use a clock supplied by the host. For instance, an SSD may be connected to the host via a PCI interface, and the host may provide a reference clock to the SSD via the PCI interface for the SSD to use when processing commands from the host. By removing the crystal oscillator (or other oscillator using a piezoelectric material), storage device vendors may save costs of hardware and simplify hardware design.

However, when a host reference clock is used instead of a crystal oscillator to activate the various functions of the storage device while a data transfer is pending. interference with this use may occur once the host stops supplying its reference clock following completion of the data transfer. For instance, even though the host may have completed sending its data to the storage device (e.g., a front-end data transfer has completed), an ASIC of the storage device may not have finished its data transfer to non-volatile memory (e.g., a back-end data transfer may still be pending), and so the storage device may still require use of a clock even after the host reference clock is lost. Moreover, since the host reference clock may be used directly in a phase locked loop (PLL) of the ASIC, a missing clock may impact the PLL and prevent storage device components from running smoothly.

One approach to address the situation where the host turns off its reference clock is to provide a relaxation oscillator within respective memory controller dies of the storage device. A relaxation oscillator may include one or more resistors and capacitors that generate an oscillating signal which may be utilized as a clock having a frequency based on a resistor-capacitor (RC) time constant. This oscillating signal or clock in turn may be used to activate various components in each memory die when the host reference clock is lost.

Relaxation oscillators may also be trimmed per die to compensate for process variations in the respective die at nominal temperature and supply voltages. For instance, resistances and capacitances may vary significantly between one memory die and the next, resulting in different RC time constants and thus different generated clock frequencies. To compensate for these process variations, an relaxation oscillator may be trimmed to adjust the RC time constant and thus the clock frequency. For example, trimming may involve dynamically adding or removing different resistors or capacitors in series or in parallel to adjust a total resistance or capacitance of the circuit, which may lead to a different RC time constant and thus a different clock frequency at nominal temperature and supply voltages. Such trimming may occur once statically at a wafer level, with the digital settings of the target resistances/capacitances for each memory die in the wafer stored in fuse during trim. Upon power-up, this information is read for each die so that the resistors and capacitors may be appropriately set to result in an accurate target clock frequency.

Thus, an on-die relaxation oscillator may self-sufficiently act as an RC-based oscillator without using an external host reference clock while in a functional mode. However, relaxation oscillators may still have frequency variation over different voltages and temperatures. For instance, even after trimming a relaxation oscillator to account for different resistances, capacitances, or other process variations, the oscillating signal frequency may still vary by 4 to 5% with respect to the host reference clock frequency due to voltage or temperature (VT) variations, thereby impacting performance at fast clocking speeds.

Another approach to address situations where the reference clock is lost is to apply a multiplying delay locked loop (MDLL). In this approach, a delay locked loop (DLL) is provided which receives a host reference clock and which uses a feedback loop in attempt to lock a generated clock in alignment with the reference clock at each nth edge of the reference clock, where n is a multiplying factor. When the reference clock is present, the components of the feedback loop are continuously tuned such that the phases of the generated clock match the phases of the reference clock. When the reference clock is lost, the MDLL becomes a ring oscillator using back-to-back inverters and which continuously outputs the generated clock, and the generated clock from the ring oscillator may have a large frequency variation over different voltages or temperatures. To address these VT variations, the ring oscillator may be trimmed to a lower frequency target than the reference clock frequency so that increases in generated clock frequency at certain voltages or temperatures do not overshoot the target clock frequency. As a result, when the host completes its data transfer to the front-end of the storage device and stops providing the host reference clock, the frequency of the clock generated by this ring oscillator may be slowly reduced from the frequency of the host reference clock in several increments to a target clock frequency.

An additional approach to address situations where the reference clock is lost is to provide a relaxation oscillator and frequency locked loop (FLL) in combination with a MDLL or PLL. In this approach, similar to the previous approach, a feedback loop is provided in which the timing of a generated clock is adjusted to match with the timing of a host reference clock, while a FLL adjusts the frequency of the generated clock. For instance, if the host reference clock has a relatively low frequency (e.g., 100 MHz), the FLL may adjust the generated clock to a relatively higher frequency (e.g., in the hundreds of MHz or 1 GHz range) to allow the generated clock to activate the various components of the storage device which operate at this higher frequency range.

Nevertheless, while the aforementioned approaches provide successful substitutes for a crystal oscillator in the event a host reference clock is lost, it would be helpful to provide smoother and faster clock frequency transitions when the host reference clock is lost while also providing further accuracy in output clock frequencies while the host reference clock is present. Accordingly, in an aspect of the present disclosure, a reference clock loss tolerant (RLT) oscillator or oscillator circuit is provided in the storage device which is configured to generate a clock using a host reference clock that is input to the circuit, and to output a clock which has a same accuracy as the host reference clock when the reference clock is available. When the host stops sending the reference clock to the storage device, the RLT oscillator may continue to provide an output clock smoothly (without glitches), although with a slightly lower frequency to compensate for VT variations. For instance, the loss of the host reference clock may trigger the oscillator circuit to output a lower frequency, oscillator-generated clock quickly within one clock cycle after the reference clock is lost. Since the host is no longer sending any data at the time its reference clock is lost, this lower frequency of the generated clock may not impact storage device performance in writing the data the host had previously sent, since the storage device may still transfer this data to the non-volatile memory in previously associated storage elements using the generated clock. Additionally, the frequency of the output clock generated from the RLT oscillator may remain within sufficient range to allow a PLL of the storage device to maintain its PLL lock, thereby allowing a clock to continue to be smoothly provided to the various components of the storage device when the host reference clock is lost. As a result, crystal oscillators may be omitted from the storage device, saving bill of materials (BOM) costs, reducing package routing constraints, and achieving improvements in supply chain management and gross margin.

FIG. 1 shows an exemplary block diagram 100 of a storage device 102 which communicates with a host device 104 (also "host") according to an exemplary embodiment. The host 104 and the storage device 102 may form a system, such as a computer system (e.g., server, desktop, mobile/laptop, tablet, smartphone, etc.). The components of FIG. 1 may or may not be physically co-located. In this regard, the host 104 may be located remotely from storage device 102. Although FIG. 1 illustrates that the host 104 is shown separate from the storage device 102, the host 104 in other embodiments may be integrated into the storage device 102, in whole or in part. Alternatively, the host 104 may be distributed across multiple remote entities, in its entirety, or alternatively with some functionality in the storage device 102.

Those of ordinary skill in the art will appreciate that other exemplary embodiments can include more or less than those elements shown in FIG. 1 and that the disclosed processes can be implemented in other environments. For example, other exemplary embodiments can include a different number of hosts communicating with the storage device 102, or multiple storage devices 102 communicating with the host(s).

The host device 104 may store data to, and/or retrieve data from, the storage device 102. The host device 104 may include any computing device, including, for example, a computer server, a network attached storage (NAS) unit, a desktop computer, a notebook (e.g., laptop) computer, a tablet computer, a mobile computing device such as a smartphone, a television, a camera, a display device, a digital media player, a video gaming console, a video streaming device, or the like. The host device 104 may include at least one processor 101 and a host memory 103. The at least one processor 101 may include any form of hardware capable of processing data and may include a general purpose processing unit (such as a central processing unit (CPU)), dedicated hardware (such as an application specific integrated circuit (ASIC)), digital signal processor (DSP), configurable hardware (such as a field programmable gate array (FPGA)), or any other form of processing unit configured by way of software instructions, firmware, or the like. The host memory 103 may be used by the host device 104 to store data or instructions processed by the host or data received from the storage device 102. In some examples, the host memory 103 may include non-volatile memory, such as magnetic memory devices, optical memory devices, holographic memory devices, flash memory devices (e.g., NAND or NOR), phase-change memory (PCM) devices, resistive random-access memory (ReRAM) devices, magnetoresistive random-access memory (MRAM) devices, ferroelectric random-access memory (F-RAM), and any other type of non-volatile memory devices. In other examples, the host memory 103 may include volatile memory, such as random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like). The host memory 103 may also include both non-volatile memory and volatile memory, whether integrated together or as discrete units.

The host 104 may also include a host memory buffer (HMB 105). The HMB 105 is a portion of host memory (e.g., host memory 103 or a different memory in host 104) that the host 104 may allocate to the storage device 102 to utilize for the storage device's own purposes. For instance, the storage device 102 may utilize the HMB 105 as an address mapping table cache or a data cache. In some examples, the HMB 105 may include volatile memory, such as RAM, DRAM, or SDRAM (e.g., DDR1, DDR2, DDR3, DDR3L, LPDDR3, DDR4, and the like). In other examples, the HMB 105 may include non-volatile memory.

The host interface 106 is configured to interface the storage device 102 with the host 104 via a bus/network 108, and may interface using, for example, Ethernet or WiFi, or a bus standard such as Serial Advanced Technology Attachment (SATA), PCI express (PCIe), Small Computer System Interface (SCSI), or Serial Attached SCSI (SAS), among other possible candidates. Alternatively, the host interface 106 may be wireless, and may interface the storage device 102 with the host 104 using, for example, cellular communication (e.g. 5G NR, 4G LTE, 3G, 2G, GSM/UMTS, CDMA One/CDMA2000, etc.), wireless distribution methods through access points (e.g. IEEE 802.11, WiFi, Hiper- LAN, etc.), Infra Red (IR), Bluetooth, Zigbee, or other Wireless Wide Area Network (WWAN), Wireless Local Area Network (WLAN), Wireless Personal Area Network (WPAN) technology, or comparable wide area, local area, and personal area technologies.

The storage device 102 includes a memory. For example, in the exemplary embodiment of FIG. 1, the storage device 102 may include a non-volatile memory (NVM) 110 for persistent storage of data received from the host 104. The NVM 110 can include, for example, flash integrated circuits, NAND memory (e.g., single-level cell (SLC) memory, multi-level cell (MLC) memory, triple-level cell (TLC) memory, quad-level cell (QLC) memory, penta-level cell (PLC) memory, or any combination thereof), or NOR memory. The NVM 110 may include a plurality of NVM memory locations 112 which may store system data for operating the storage device 102 or user data received from the host for storage in the storage device 102. For example, the NVM may have a cross-point architecture including a 2-D NAND array of NVM memory locations 112 having n rows and m columns, where m and n are predefined according to the size of the NVM. In the exemplary embodiment of FIG. 1, each NVM memory location 112 may be a die 114 including multiple planes each including multiple blocks of multiple cells 116. Alternatively, each NVM memory location 112 may be a plane including multiple blocks of the cells 116. The cells 116 may be single-level cells, multi-level cells, triple-level cells, quad-level cells, and/or penta-level cells, for example. Other examples of NVM memory locations 112 are possible; for instance, each NVM memory location may be a block or group of blocks. Each NVM memory location may include one or more blocks in a 3-D NAND array. Each NVM memory location 112 may include one or more logical blocks which are mapped to one or more physical blocks. Alternatively, the memory and each NVM memory location may be implemented in other ways known to those skilled in the art.

The storage device 102 also includes one or more volatile memories 117, 118 that can, for example, include a Dynamic Random Access Memory (DRAM) or a Static Random Access Memory (SRAM). For example, as illustrated in FIG. 1, volatile memory 117 may be an SRAM internal to (or integrated into) controller 123 of the storage device 102, while volatile memory 118 may be a DRAM external to (or remote from) controller 123 of the storage device 102. However, in other examples, volatile memory 117 may be a DRAM external to controller 123 and volatile memory 118 may be an SRAM internal to controller 123, volatile memory 117, 118 may both be internal to controller 123 or both be external to controller 123, or alternatively, storage device 102 may include only one of volatile memory 117, 118. Data stored in volatile memory 117, 118 can include data read from the NVM 110 or data to be written to the NVM 110. In this regard, the volatile memory 117, 118 can include a write buffer or a read buffer for temporarily storing data.

The memory (e.g. NVM 110) is configured to store data 119 received from the host device 104. The data 119 may be stored in the cells 116 of any of the NVM memory locations 112. As an example, FIG. 1 illustrates data 119 being stored in different NVM memory locations 112, although the data may be stored in the same NVM memory location. In another example, the NVM memory locations 112 may be different dies, and the data may be stored in one or more of the different dies.

Each of the data 119 may be associated with a logical address. For example, the volatile memory 118 may store a logical-to-physical (L2P) mapping table 120 for the storage device 102 associating each data 119 with a logical address. The L2P mapping table 120 stores the mapping of logical addresses specified for data written from the host 104 to physical addresses in the NVM 110 indicating the location (s) where each of the data is stored. This mapping may be performed by the controller 123 of the storage device. The L2P mapping table may be a table or other data structure which includes an identifier such as a physical address associated with each memory location 112 in the NVM where data is stored. While FIG. 1 illustrates a single L2P mapping table 120 stored in volatile memory 118, in other examples, the L2P mapping table 120 may include multiple tables stored in volatile memory 118. Mappings may be updated in the L2P mapping table 120 respectively in response to host writes, and periodically the L2P mapping table 120 may be flushed from volatile memory 118 to one or more of the NVM memory locations 112 of NVM 110 so that the mappings may persist across power cycles. In the event of a power failure in storage device 102, the L2P mapping table 120 in volatile memory 118 may be recovered during initialization from the L2P entries previously stored in NVM 110.

Figure 2:
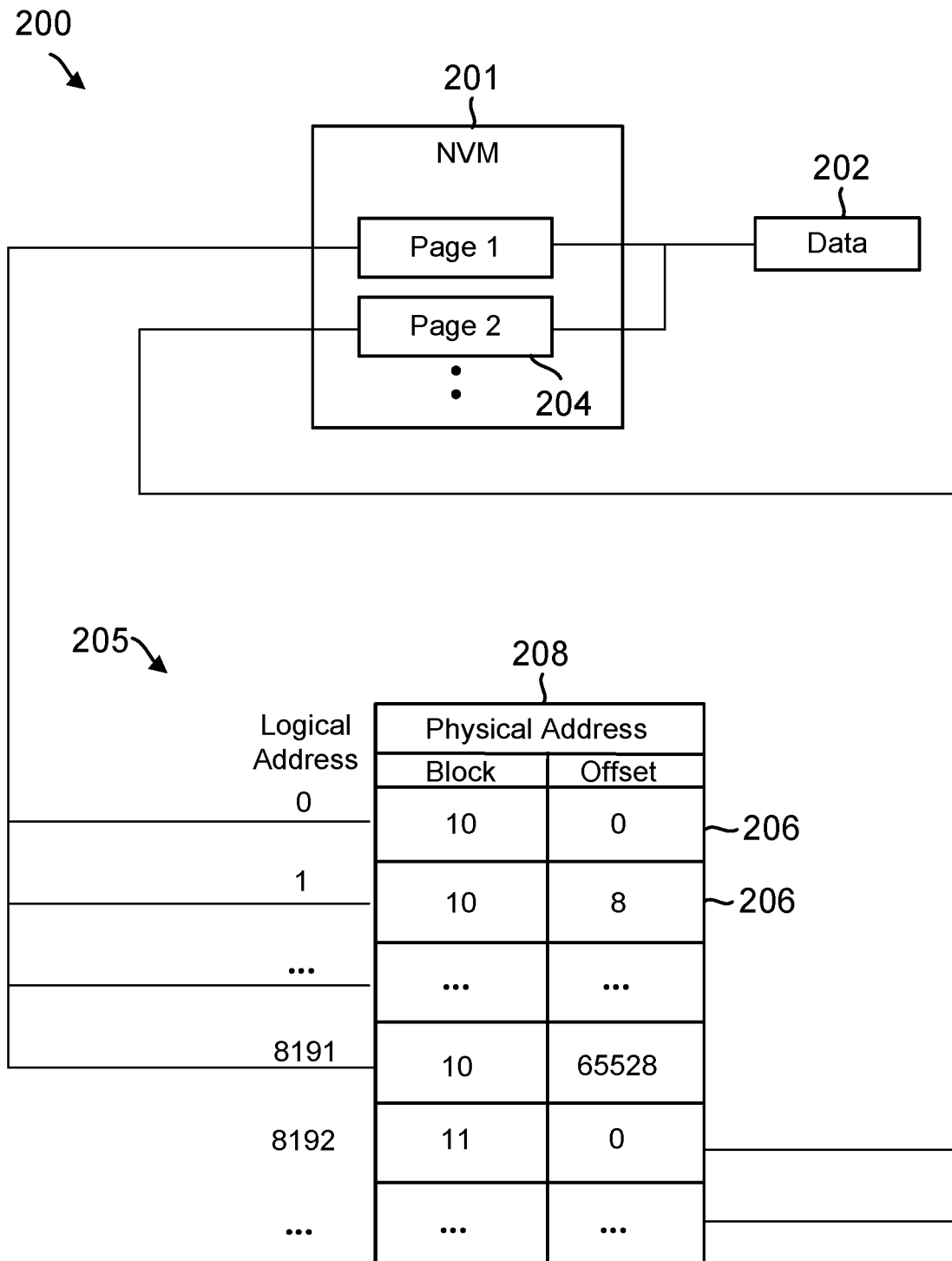
FIG. 2 is a conceptual diagram illustrating an example of a logical-to-physical mapping table in a non-volatile memory of the storage device of FIG. 1.

FIG. 2 is a conceptual diagram 200 of an example of an L2P mapping table 205 stored in volatile memory (e.g., the volatile memory 118 of FIG. 1) illustrating the mapping of data 202 received from a host device to logical addresses and physical addresses in NVM 201 (e.g., the NVM 110 of FIG. 1). The data 202 may correspond to the data 119 in FIG. 1, while the L2P mapping table 205 may correspond to the L2P mapping table 120 in FIG. 1. In one example, the data 202 may be stored in one or more pages 204 (e.g., physical pages) in NVM 201. Each page 204 may be associated with a mapping set including one or more entries 206 of the L2P mapping table 205 respectively identifying a physical address 208 mapped to a logical address (e.g., a logical block address (LBA)) associated with the data written to the NVM. A logical page may include one or more of the entries 206. An LBA may be a logical address specified in a write command for the data received from the host device. Physical address 208 may indicate the block and the offset at which the data associated with an LBA is physically written, as well as a length or size of the written data (e.g. 4 KB or some other size). In the illustrated example, page 204 encompassing 32 KB of data 202 may be associated with a mapping set including 8192, 4 KB entries. However, in other examples, page 204 may encompass a different amount of host data (e.g. other than 32 KB of host data) or may include a different number of entries 206 (e.g., other than 8192 entries), or entries 206 may respectively include different host data lengths (e.g., other than 4 KB each).

Referring back to FIG. 1, the NVM 110 includes sense amplifiers 124 and data latches 126 connected to each NVM memory location 112. For example, the NVM memory location 112 may be a block including cells 116 on multiple bit lines, and the NVM 110 may include a sense amplifier 124 on each bit line. Moreover, one or more data latches 126 may be connected to the bit lines and/or sense amplifiers. The data latches may be, for example, shift registers. When data is read from the cells 116 of the NVM memory location 112, the sense amplifiers 124 sense the data by amplifying the voltages on the bit lines to a logic level (e.g. readable as a '0' or a '1'), and the sensed data is stored in the data latches 126. The data is then transferred from the data latches 126 to the controller 123, after which the data is stored in the volatile memory 118 until it is transferred to the host device 104. When data is written to the cells 116 of the NVM memory location 112, the controller 123 stores the programmed data in the data latches 126, and the data is subsequently transferred from the data latches 126 to the cells 116.

The storage device 102 includes a controller 123 which includes circuitry such as one or more processors for executing instructions and can include a microcontroller, a Digital Signal Processor (DSP), an Application-Specific Integrated Circuit (ASIC), a system on a chip (SoC), a Field Programmable Gate Array (FPGA), hard-wired logic, analog circuitry and/or a combination thereof.

The controller 123 is configured to receive data transferred from one or more of the cells 116 of the various NVM memory locations 112 in response to a read command. For example, the controller 123 may read the data 119 by activating the sense amplifiers 124 to sense the data from cells 116 into data latches 126, and the controller 123 may receive the data from the data latches 126. The controller 123 is also configured to program data into one or more of the cells 116 in response to a write command. For example, the controller 123 may write the data 119 by sending data to the data latches 126 to be programmed into the cells 116. The controller 123 is further configured to access the L2P mapping table 120 in the volatile memory 118 when reading or writing data to the cells 116. For example, the controller 123 may receive logical-to-physical address mappings from the volatile memory 118 in response to read or write commands from the host device 104, identify the physical addresses mapped to the logical addresses identified in the commands (e.g. translate the logical addresses into physical addresses), and access or store data in the cells 116 located at the mapped physical addresses. The controller 123 is also configured to access the L2P mapping table 120 in the NVM 110, for example, following a power failure during initialization, to recover or populate the L2P mapping table 120 in the volatile memory 118.

The controller 123 and its components may be implemented with embedded software that performs the various functions of the controller described throughout this disclosure. Alternatively, software for implementing each of the aforementioned functions and components may be stored in the NVM 110 or in a memory external to the storage device 102 or host device 104, and may be accessed by the controller 123 for execution by the one or more processors of the controller 123. Alternatively, the functions and components of the controller may be implemented with hardware in the controller 123, or may be implemented using a combination of the aforementioned hardware and software.

In operation, the host device 104 stores data in the storage device 102 by sending a write command to the storage device 102 specifying one or more logical addresses (e.g., LBAs) as well as a length of the data to be written. The interface element 106 receives the write command, and the controller allocates a NVM memory location 112 in the NVM 110 of storage device 102 for storing the data. The controller 123 stores the L2P mapping in the L2P mapping table 120 to map a logical address associated with the data to the physical address of the NVM memory location 112 allocated for the data. The controller 123 then stores the data in the NVM memory location 112 by sending it to one or more data latches 126 connected to the allocated NVM memory location, from which the data is programmed to the cells 116.

The host 104 may retrieve data from the storage device 102 by sending a read command specifying one or more logical addresses associated with the data to be retrieved from the storage device 102, as well as a length of the data to be read. The interface 106 receives the read command, and the controller 123 accesses the L2P mapping in the L2P mapping table 120 to translate the logical addresses specified in the read command to the physical addresses indicating the location of the data. The controller 123 then reads the requested data from the NVM memory location 112 specified by the physical addresses by sensing the data using the sense amplifiers 124 and storing them in data latches 126 until the read data is returned to the host 104 via the host interface 106.

In an aspect of the present disclosure, the storage device 102 may also include an RLT oscillator 128 (also referred to throughout this disclosure as an oscillator circuit) which is configured to receive a host reference clock 130 from host 104 via interface 106 and to provide a clock to the dies 114, sense amplifiers 124, latches 126, and other components of storage device 102 (e.g., via a PLL or frequency multiplier) to trigger these components to perform their respective, previously described functions. The clock may be configured to have a same accuracy as the host reference clock 130 when the reference clock is available (e.g., still being received from host 104). In the illustrated example, RLT oscillator 128 may be located inside controller 123, although in other examples, RLT oscillator 128 may be located elsewhere in storage device 102. When the host 104 stops sending the host reference clock 130 to the storage device 102, the RLT oscillator may continue to output its clock to the various storage device components smoothly at a slightly lower frequency to compensate for VT variations. This frequency reduction may be configured to occur only while the reference clock is lost, in contrast to on-die relaxation oscillators where the output clock frequency may be reduced even while the host reference clock is present. Additionally, when the reference clock is lost or present, the RLT oscillator is configured to output the clock to the storage device components via a PLL which may settle to either the host reference clock frequency or the reduced generated clock frequency smoothly (e.g., without major overshoots or undershoots in response to frequency variations), thereby maintaining its PLL lock and otherwise unaffecting the performance of the storage device 102.

Figure 3:
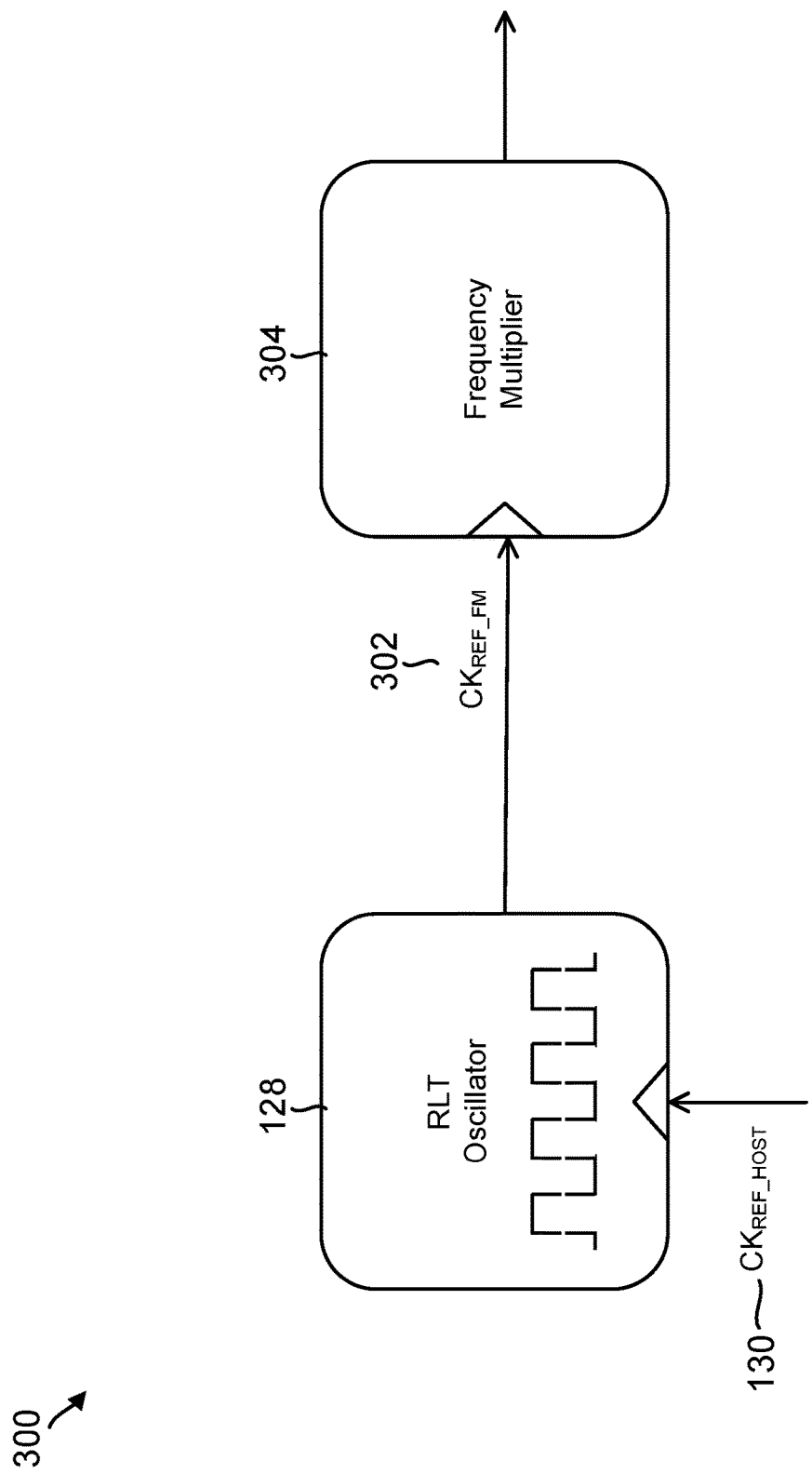
FIG. 3 is a conceptual diagram illustrating an example of a system including a reference clock loss tolerant (RLT) oscillator in the storage device of FIG. 1.

FIG. 3 illustrates an example of a system 300 including RLT oscillator 128. The RLT oscillator 128 may be configured to provide a generated, output clock 302 to the various components of the storage device 102 via a frequency multiplier 304, such as a PLL. The RLT oscillator may output the clock at a same frequency or a division factor of the frequency of host reference clock 130 received from the host 104. For example, if the RLT oscillator receives a host reference clock $CK_{REF\_HOST}$ at a frequency of 100 MHz, the RLT oscillator may output to frequency multiplier 304 an output clock $CK_{REF\_FM}$ at a 25 MHz frequency based on a division factor of 4. When the reference clock is stopped being transmitted to the storage device by the host 104, the RLT oscillator 128 may provide the output clock 302 at a slightly lower frequency than that of the host reference clock 130. For example, the frequency of output clock 302 may be reduced with respect to the host reference clock 130, or with respect to a division factor of the host reference clock 130, by 0 to 8%, resulting in output clock $CK_{REF\_FM}$ being 23 MHz or more. The PLL or frequency multiplier 304 may receive this output clock 302 and be designed by one of ordinary skill in the art to increase the clock frequency to a frequency usable by the various components of the storage device (e.g., in the hundreds of MHz or in the GHz range).

Thus, the RLT oscillator 128 may be configured to generate output clock 302 when the host reference clock 130 is lost, which may be at a reduced frequency with respect to the host reference clock 130 (or its division factor). The RLT oscillator 128 may be configured to act as a relaxation oscillator while the host reference clock 130 is unavailable or lost, and to act as a feedback loop or a clock buffer for clock generation while the host reference clock is present. The RLT oscillator 128 may be configured to trim or reduce the host reference clock frequency to result in the generated clock frequency, for example, by ±4% with respect to the host reference clock frequency. The RLT oscillator 128 may be configured to include multiple RC circuits that are respectively configured to generate a clock at a shifted phase with respect to an input clock. The RLT oscillator 128 may be configured to trim the relaxation circuits to account for VT variations in the host reference clock frequency.

In some aspects, the controller 123 or RLT oscillator 128 includes an oscillator circuit configured to generate a clock based on a host reference clock, and output an output clock to the memory die, where while the host reference clock is available, the output clock includes a frequency that is identical to a frequency or a division factor of the frequency of the host reference clock, and in response to loss of the host reference clock, the oscillator circuit is configured to reduce the frequency of the output clock to a frequency of the generated clock within a generated clock cycle following the loss of the host reference clock. In some aspects, the oscillator circuit is configured to increase the frequency of the output clock back to the frequency of the host reference clock in response to re-availability of the host reference clock following the loss. In some aspects, the oscillator circuit is configured to reduce the frequency of the output clock to the frequency of the generated clock without losing a lock status of a PLL coupled to the oscillator circuit. In some aspects, the oscillator circuit is configured to output the output clock to the memory die via a frequency multiplier circuit configured to multiply the frequency of the output clock. In some aspects, the oscillator circuit includes a clock generation circuit configured to generate the clock based on the host reference clock, and a clock selection circuit configured to select the output clock from the host reference clock or the generated clock. In some aspects, the oscillator circuit is configured to select the output clock from the generated clock in response to the loss of the host reference clock. In some aspects, the oscillator circuit is configured to select a positive (rising) edge of the output clock from the host reference clock in response to an availability of the host reference clock. In some aspects, the oscillator circuit is configured to shift a phase of the host reference clock a plurality of times. In some aspects, the oscillator circuit is configured to detect a loss of the host reference clock. In some aspects, the oscillator circuit is configured to generate a reference sense signal indicating an availability of the host reference clock. In some aspects, during a time period in which the host reference clock is available, a positive edge of the output clock is aligned in time with a positive edge of the host reference clock and a negative edge of the output clock is aligned in time with a negative edge of the generated clock during a respective clock cycle of the host reference clock, and during a time period in which the host reference clock is lost, a positive edge of the output clock is aligned in time with a positive edge of the generated clock within a generated clock cycle following the loss of the host reference clock.

In some aspects, the controller 123 or RLT oscillator 128 includes an oscillator circuit configured to: generate a clock based on a host reference clock, and output an output clock to the memory die; where while the host reference clock is available, a positive edge of the output clock is aligned in time with a positive edge of the host reference clock and a negative edge of the output clock is aligned in time with a negative edge of the generated clock during a respective clock cycle of the host reference clock, and in response to loss of the host reference clock, a positive edge of the output clock is aligned in time with a positive edge of the generated clock within a generated clock cycle following the loss. In some aspects, the oscillator circuit is configured to shift a phase of the host reference clock, and to output the negative edge of the generated clock based on the shifted phase. In some aspects, the oscillator circuit is configured to trim the generated clock at a lower frequency than a frequency of the host reference clock to compensate for process variations. In some aspects, the oscillator circuit is configured to generate a reference sense signal indicating an availability of the host reference clock for a plurality of host reference cycles, and to select the positive edge of the host reference clock as the output clock following occurrence of the plurality of host reference cycles. In some aspects, the oscillator circuit is configured to detect loss of the host reference clock, and to reduce a frequency of the output clock to a frequency of the generated clock within a generated clock cycle following the detection. In some aspects, the oscillator circuit is configured to increase a frequency of the output clock to the frequency of the host reference clock in response to an availability of the host reference clock without losing a lock status of a PLL coupled to the oscillator circuit.

In some aspects, the controller 123 or RLT oscillator 128 includes an oscillator circuit configured to: generate a clock based on a host reference clock, and output an output clock to the memory die; where while the host reference clock is available, the oscillator circuit is configured to output the output clock at a frequency that is identical to a frequency of the host reference clock or a division factor of the frequency of the host reference clock, in response to loss of the host reference clock, the oscillator circuit is configured to reduce the frequency of the output clock to a frequency of the generated clock within a generated clock cycle following the loss, and in response to re-availability of the host reference clock, the oscillator circuit is configured to increase the frequency of the output clock back to the frequency of the host reference clock within a plurality of host reference clock cycles following the re-availability. In some aspects, during a time period in which the host reference clock is available, the oscillator circuit is configured to align a positive edge of the output clock in time with a positive edge of the host reference clock and to align a negative edge of the output clock in time with a negative edge of the generated clock during a respective clock cycle of the host reference clock, and during a time period in which the host reference clock is lost, the oscillator circuit is configured to align a positive edge of the output clock in time with a positive edge of the generated clock within a generated clock cycle following the loss of the host reference clock.

The controller 123 and/or RLT oscillator 128 may be configured to perform any of the aforementioned functions and/or other functions, for example, using one or more of the components of the oscillator circuit illustrated and described below with respect to FIGS. 4A-4C.

Figure 4A:
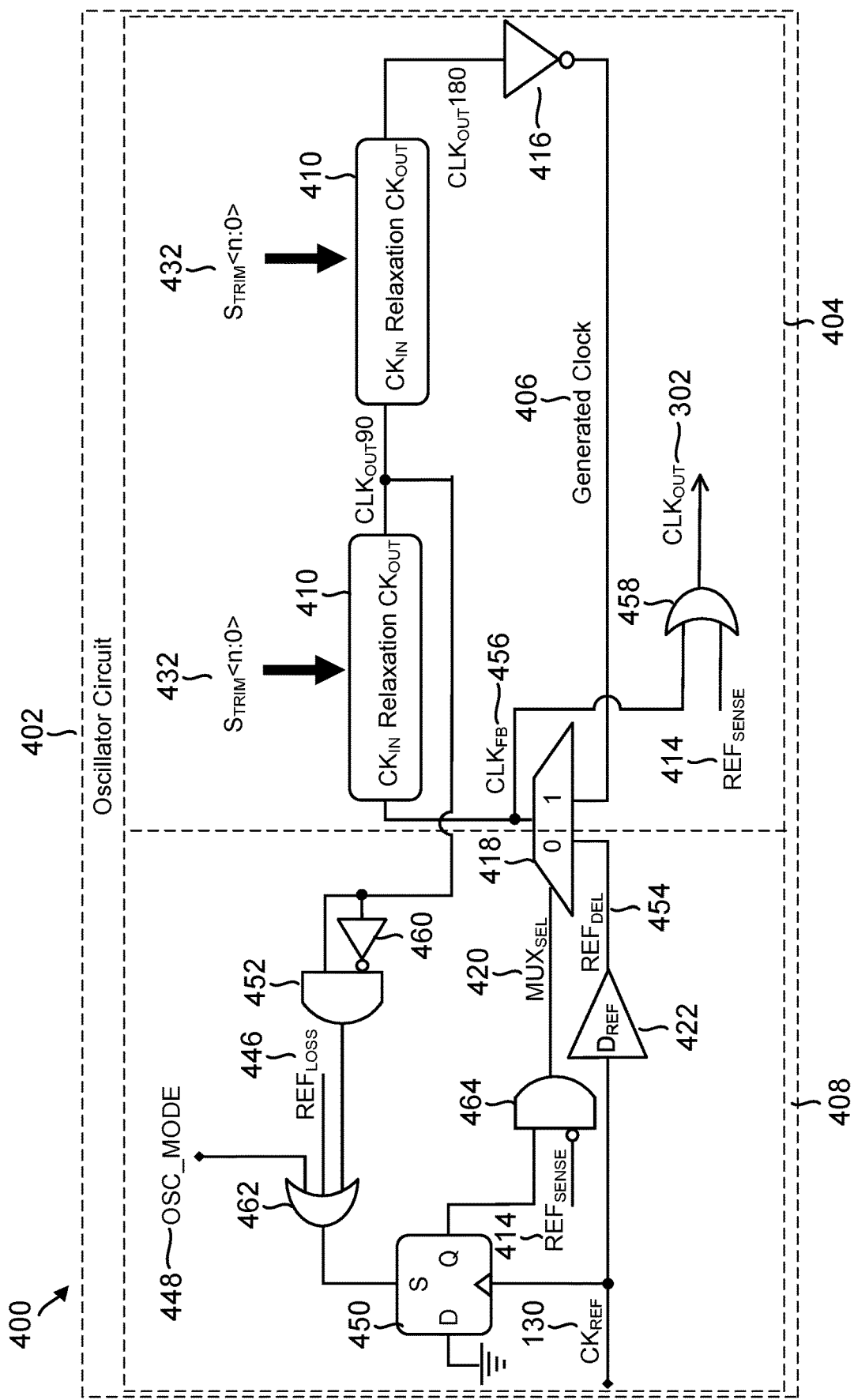
FIGS. 4A-4C are conceptual diagrams illustrating an example circuit design for the RLT oscillator in the storage device of FIG. 1.
Figure 4B:
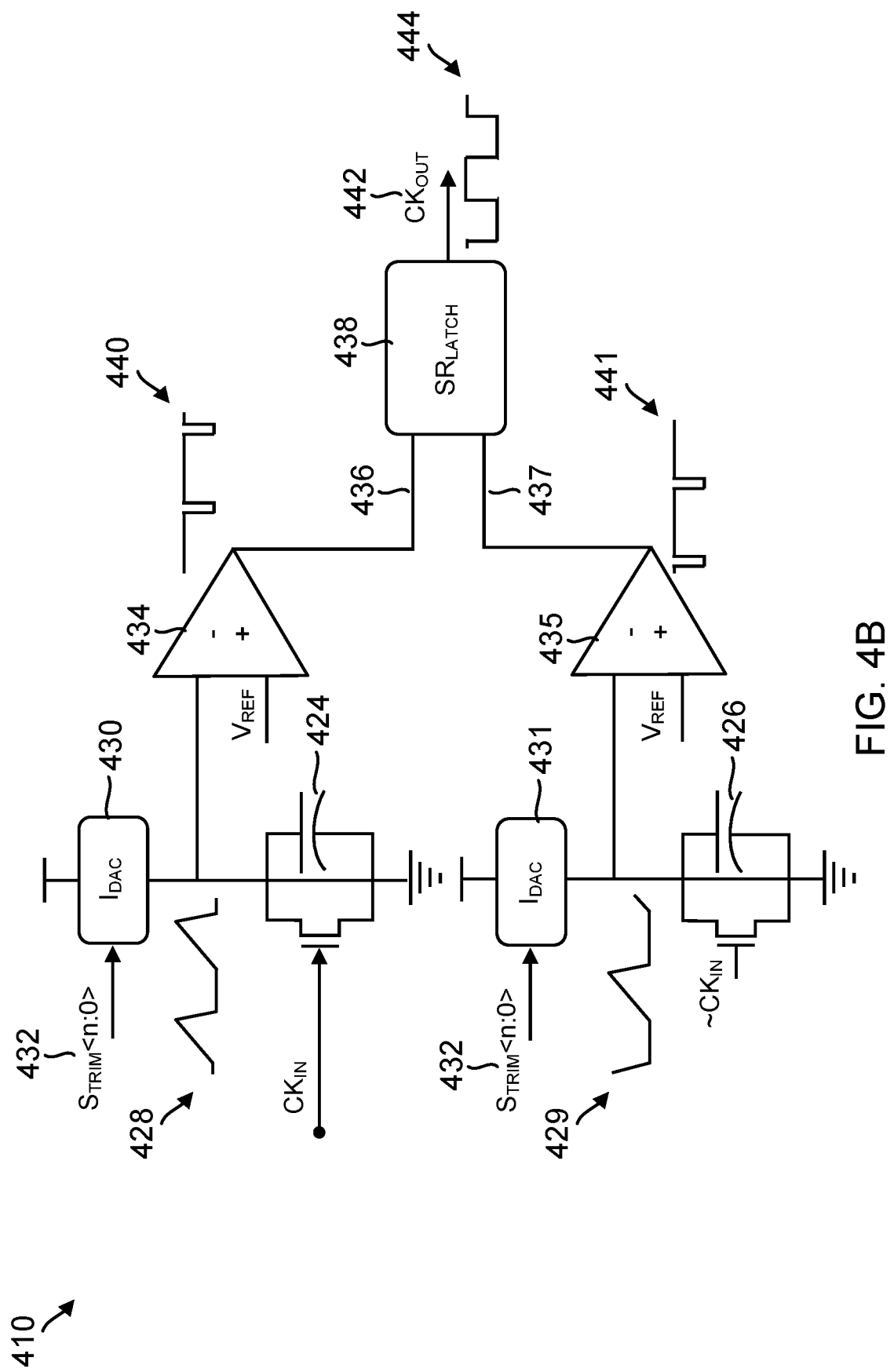
Figure 4C:
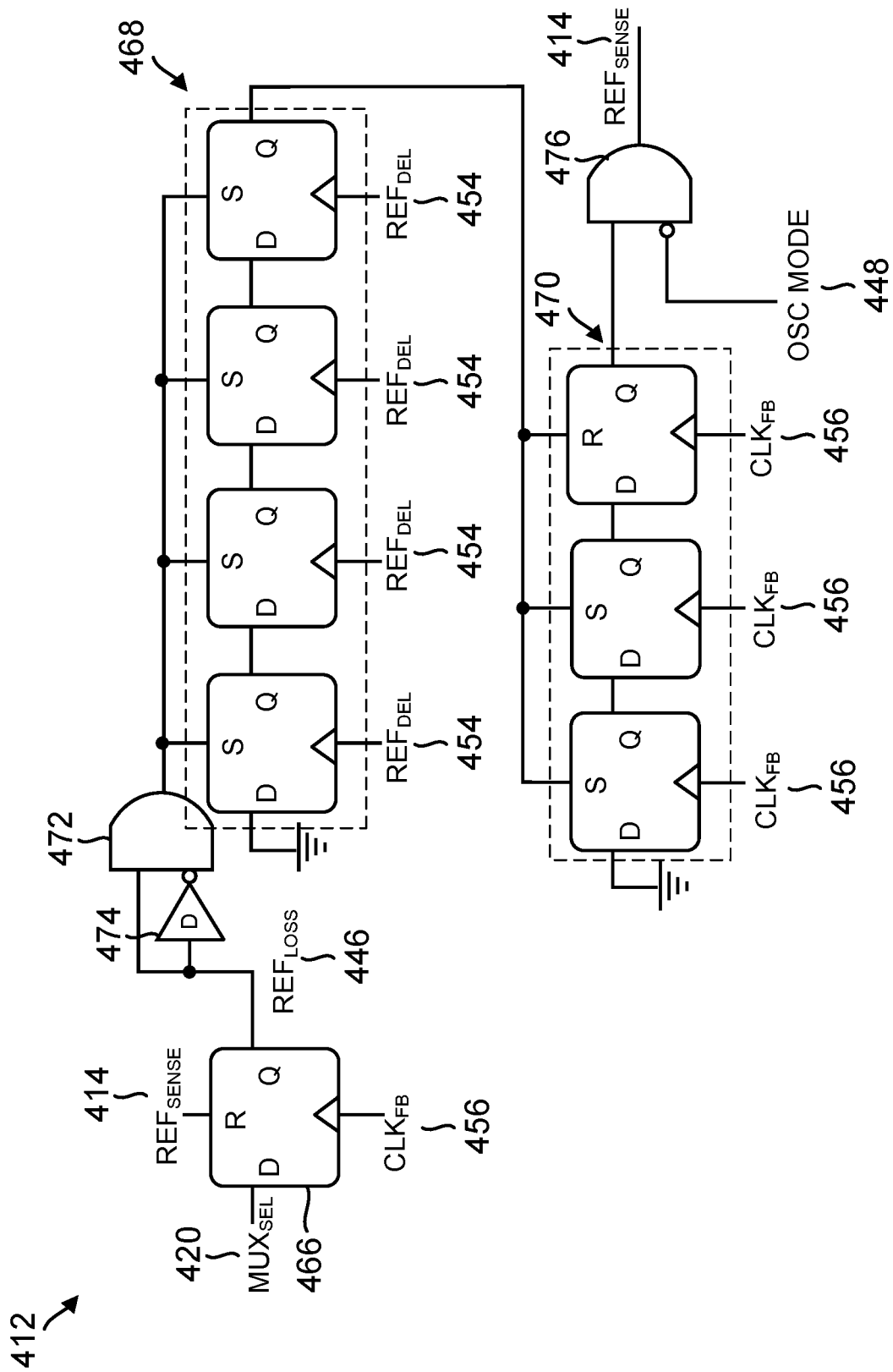

FIGS. 4A-4C illustrate an example 400 of an oscillator circuit 402 (e.g., a circuit design for RLT oscillator 128). Referring to FIG. 4A, in this example the oscillator circuit 402 may include a clock generation circuit 404 configured to generate a clock 406 from host reference clock 130, a clock selection circuit 408 configured to select to output the host reference clock 130 or the generated clock 406 as output clock 302, a plurality of relaxation circuits 410 (see also FIG. 4B) respectively configured to shift a phase of the host reference clock 130 or the generated clock 406, and a circuit 412 (see FIG. 4C) configured to indicate a loss of the host reference clock 130 via a reference loss signal 446 and to generate a reference sense signal 414 when the host reference clock is available. In other examples, the oscillator circuit 402 may include one or more of the aforementioned circuits or components. Although a particular structure and arrangement of hardware, wires, circuits, and other components of oscillator circuit 402 has been illustrated in the examples of FIGS. 4A-4C which allow RLT oscillator 128 to perform its various functions of RLT oscillator 128 described throughout this disclosure, it should be understood that RLT oscillator 128 may be configured to perform these same functions using a different structure or arrangement of hardware, wires, circuits, and/or other components of oscillator circuit 402 in other examples.

Referring to the example shown in FIG. 4A, the oscillator circuit 402 is configured such that when the host reference clock 130 is present, the positive (rising) edge of the clock will be passed through the circuit and output in the output clock 302. The oscillator circuit 402 is also configured such that, after passing the positive edge of the host reference clock 130 to the output clock 302 and following a 90 degree phase shift of the host reference clock (resulting in signal $CLK_{OUT}90$), a generated clock 406 produced in the oscillator circuit is selected to be output in the output clock 302. The oscillator circuit 402 in this example may include multiple relaxation circuits 410 arranged in a feedback loop including an inverter 416, where each of these components may modify an input phase of the generated clock 406 or host reference clock 130. A multiplexer 418 may be included in the oscillator circuit 402 that is configured to select the host reference clock 130 to be passed as the output clock 302 in response to one input value of a multiplexer select signal 420 (in this example, a value of 0 for $MUX_{SEL}$), and to select the generated clock 406 to be passed as the output clock 302 in response to a different input value of the multiplexer select signal 420 (in this example, a value of 1 for $MUX_{SEL}$). While the multiplexer 418 is configured to select the generated clock 406 to be passed as the output clock 302 (e.g., the multiplexer select signal 420 is 1), the oscillator circuit 402 may operate similarly to a relaxation oscillator which shifts the generated clock 406 by phases and feedbacks the clock to itself to continuously produce the generated clock 406 at the output clock 302. However, while the multiplexer 418 is configured to select the host reference clock 130 to be passed as the output clock 302 (e.g., the multiplexer select signal 420 is 0), the host reference clock 130 instead of the generated clock 406 is output from the oscillator circuit 402 or clock generation circuit 404 directly, independently of the generated clock 406.

The oscillator circuit 402 is configured such that when the multiplexer select signal 420 is one value (e.g., 0), the positive, rising edge of the host reference clock 130 is passed through a delay buffer 422 via the multiplexer 418 to be output in the output clock 302. The host reference clock 130 is also input to a first one of the relaxation circuits 410, which relaxation circuit is configured to phase shift the host reference clock signal by 90 degrees. For instance, the relaxation circuit 410, more details of which are described below with respect to FIG. 4B, may be an RC circuit which results in an output signal ($CLK_{OUT}90$) shifted by 90 degrees with respect to the input signal. This 90 degree, shifted clock signal may be input to the second one of the relaxation circuits 410, which similarly shifts the clock by another 90 degree phase to result in a total, 180 degree phase change. This 180 degree, phase shifted reference clock signal ($CLK_{OUT}180$) is passed to the inverter 416, which results in the generated clock 406 at a 360 degree phase shift with respect to the host reference clock 130. Moreover, the oscillator circuit 402 is configured such that when the rising edge of the 90 degree phase of the reference clock occurs (such that its value becomes high), the multiplexer 418 is triggered to select the generated clock 406 to be passed through to the output clock 302 in response to the multiplexer select signal 420 being changed to a different value (e.g., 1). Therefore, from 90 degree phase onward with respect to the host reference clock, this generated clock will be instead passed to the relaxation circuits 410 and inverter 416 and similarly phase shifted by 90, 180, and 360 degrees following the multiplexer selection. If the host reference clock 130 remains available, then upon the next positive (rising) edge of the host reference clock 130 (or the next zero degree phase of the clock cycle), the value of the multiplexer select signal 420 is changed back to its earlier value (e.g., 0) and the multiplexer 418 is accordingly triggered to pass the host reference clock 130 back as the output clock 302. Thus, for every host reference clock cycle, between 0 and 90 degrees phase of the host reference clock, the host reference clock 130 is output from the oscillator circuit (its rising clock edge) as the output clock 302, while from 90 degree to 360 degree phase of the host reference clock, the generated clock 406 is output from the oscillator circuit (its negative clock edge) as the output clock 302. An illustration of this timing can be seen in FIG. 5, described in more detail below.

As a result, the timing of the host reference clock 130 and the timing of the generated clock 406 may match each output clock cycle. However, even if an error in timing (and thus frequency) occurs in the generated clock 406 with respect to the host reference clock 130, for example due to VT variations, this error may not be reflected at the output while the rising edge of the host reference clock is present. For instance, assume in one example that after the rising edge of the host reference clock 130 is output from the multiplexer 418 and input into the first one of the relaxation circuits 410, the relaxation circuit delays the phase of the clock by 85 degrees instead of 90 degrees due to VT variations. Similarly with the second one of the relaxation circuits 410, assume in this example that the phase of the clock may be again delayed by 85 degrees instead of 90 degrees, resulting in a total shift of 170 degrees instead of 180 degrees, and thus the inverter 416 results in a 350 degree, phase shifted output instead of a 360 degree, phase shifted output for the generated clock 406. In such case, passing of the generated clock 406 through the multiplexer 418 to be output as the output clock 302 may result in period jitter at the output clock 302 (e.g., since a 360 degree or 0 degree phase shift is expected rather than a 350 degree phase shift, resulting in a period jitter corresponding to 10 degree phase shift). However, since the oscillator circuit 402 is designed such that the positive rising edge of the host reference clock is output during this time instead of the generated clock 406 (at 0 degrees/360 degrees), this error in the generated clock 406 may be effectively ignored. Thus, notwithstanding this error in the generated clock that may arise due to VT variations, this error may be disregarded while the host reference clock is present, since the next positive rising edge of the host reference clock 130 is output (e.g., with 0 degree phase shift) rather than that of the generated clock 406 (e.g., with 350 degree phase shift).

Accordingly, the oscillator circuit 402 is configured such that the host reference clock 130 itself is passed directly to the output of the oscillator circuit 402 when the reference clock is present between each 0 and 90 degree phase, thereby resulting in the accuracy of the output clock 302 being as close as possible to that of the host reference clock 130 during these times. Thus, while the host reference clock is still present, then even with VT variations that may result in a frequency variation or period jitter in the generated clock between the 90 and 360 degree phases of the host reference clock 130, the reference clock (its positive edge) may be passed to the oscillator circuit output as-is (without frequency variation or jitter). Moreover, the oscillator circuit 402 is configured such that, if the host reference clock 130 is lost (no longer being received), a smooth transition between the host reference clock 130 being passed as the output clock 302 and the generated clock 406 being passed as the output clock 302 may occur. For instance, not only may the generated clock 406 be output as before after the last available rising edge of the host reference clock 130 (from 90 degree to 360 degree phase), here the generated clock may further be output at the time of its own rising edge (at 0 degree phase), and the generated clock may continue being output accordingly. Furthermore, the output transition is configured to be glitch-less, namely, without a settling time between the output of one clock and the other clock. For instance, although a frequency variation may be observed at the output while the host reference clock is lost (e.g., a reduction in frequency of 0-8%), this reduction in frequency of the generated clock compared to the reference clock is relatively small. As a result, the transition of one clock to the other when the reference clock is lost may occur immediately (in a next clock cycle) without losing a PLL lock (notwithstanding there being still some PLL settling that occurs).

Now referring to FIG. 4B, an example of a relaxation circuit 410 in the oscillator circuit 402 is provided. In this example, the relaxation circuit 410 may receive two clock signals, including the host reference clock 130 or generated clock 406 (represented as the positive clock signal $CK_{IN}$), and an inverted or negative transformation of this clock signal (represented as the negative clock signal $\sim CK_{IN}$). The relaxation circuit 410 may include a first capacitor 424 coupled to the positive clock signal input and a second capacitor 426 coupled to the negative clock signal input. A timing diagram 428, 429 representing the voltage across a given capacitor is illustrated next to the respective capacitor. A current source 430, 431 coupled to each capacitor generates a current $I_{DAC}$ which respectively charges the capacitor 424, 426 when the positive clock signal $CK_{IN}$ is low or the negative clock signal $\sim CK_{IN}$ is high. Each current source 430, 431 may be configured to output different amounts of current based on a trim setting the controller 123 applies on a data trim bus 432 (an n+1-bit $S_{Trim}$ bus) coupled to the respective current source. The capacitors 424, 426 charge at different times in response to current from the current sources 430, 431 respectively until their voltages reach a reference voltage level $V_{ref}$, after which these capacitors are respectively discharged at faster rates than they were originally charged as illustrated in timing diagrams 428, 429. Furthermore, a comparator 434, 435 respectively coupled to each capacitor 424, 426 may have its own, respective output 436, 437 coupled to an SR latch 438 as inputs. A timing diagram 440, 441 representing the voltage output from each comparator is illustrated next to the respective comparator, where negative pulses correspond to respective capacitor discharges. Since the capacitors 424, 426 respectively charge and discharge at different times, the comparator outputs respectively result in setting or resetting of the SR latch 438 at different times to result in a clock output signal 442 ($CK_{OUT}$) which oscillates between high and low voltages in a square wave such as illustrated in timing diagram 444. While timing diagram 444 illustrates an ideal square wave, the duty cycle of the clock output signal 442 may in practice deviate between different clock cycles.

Referring back to FIG. 4A, while relaxation circuit 410 may include similar components to those of a relaxation oscillator, oscillator circuit 402 is configured differently than a typical relaxation oscillator. For instance, a relaxation oscillator generally includes a self-feedback loop where the clock output signal 442 ($CK_{OUT}$) is fed back to the clock input of the same relaxation circuit (as the positive clock signal $CK_{IN}$). Such oscillators may have their resistors and capacitors values configured so as to shift the phase of an input signal by 180 degrees, which when fed back to itself, may result in an oscillation of a signal. However in the oscillator circuit 402 of the storage device 102, here the resistors and capacitors are configured such that the clock output signal is not shifted by 180 degrees but instead by 90 degrees in each relaxation circuit 410, and the clock output signal 442 is not fed back as an input to the same relaxation circuit but is instead input into a different relaxation circuit in the oscillator circuit 402. For instance, in the example of FIG. 4A, oscillator circuit 402 is configured such that the output of the multiplexer 418 is coupled to the first one of the relaxation circuits 410, which output is in turn coupled to the input of the second one of the relaxation circuits 410, which output is in turn configured to return via inverter 416 to the multiplexer 418. Therefore, the oscillator circuit 402 is configured to simulate a ring oscillator more than a relaxation oscillator while the host reference clock 130 is present, with its various components configured to delay the host reference clock by a total time equal to that of a host reference clock cycle such that the positive edge of the host reference clock 130 aligns in time with the positive edge of the generated clock 406. In contrast, when the host reference clock 130 is lost, the oscillator circuit 402 may then simulate a relaxation oscillator, since the inverted, 180 degree clock output of the second one of the relaxation circuits 410 would be fed back to the first one of the relaxation circuits 410 (including its normal and inverted inputs) through the multiplexer 418.

In this example, the 90 degree output of the first one of the relaxation circuits 410 ($CLK_{OUT}90$), in addition to a reference clock loss signal 446 and an oscillator mode signal 448, are configured to control a latch 450 (e.g., a D flipflop with set input) to trigger the multiplexer 418 to switch from outputting the host reference clock 130 to outputting the generated clock 406 during certain times. These times when the generated clock 406 is output include when the host reference clock is between 90 and 360 degrees shifted from its positive edge in a current cycle, when the host reference clock is lost, or when the relaxation circuits 410 are being trimmed (via the data trim bus 432). For instance, either a 1/high value at a 90 degree phase shift of the host reference clock 130 (i.e., its rising edge), the reference clock loss signal 446 triggered with a 1/high value, or the oscillator mode signal set to a 1/high value, may result in setting of the latch 450, which will result in the latch output (Q) being set to 1/high and the multiplexer 418 thus selecting to pass the current value of the generated clock 406 to the output clock 302.

The oscillator circuit 402 is configured such that the 90 degree phase shifted output ($CLK_{OUT}90$) rather than the 180 degree phase shifted output (CLK$_{OUT}$180) is passed to the latch 450. This configuration is to avoid glitches in output clock timing upon loss of the host reference clock 130 at a time when its rising edge arrives or the reference clock is 1/high value. For instance, even if VT variations result in a duty cycle difference between the frequency of the reference clock and its 90 degrees phase delay (e.g., if the phase shift is by 85 or 95 degrees instead of 90 degrees due to VT variations), the host reference clock 130 is still 1/high value at a 90 degree phase shift. Moreover, the oscillator circuit 402 is configured such that the latch 450 is triggered during this 1/high value, for example, as a result of AND gate 452 passing a 1/high value upon CLK$_{OUT}$90 going high. Therefore, since at the time of the 90 degree phase shift, the host reference clock 130 is still 1/positive and has not reached its falling edge, the generated clock would have a 1/positive value at the time that the host reference clock had a 1/positive value. As a result, the generated clock 406 may be output without a glitch following a clock switch in the multiplexer 418 when the host reference clock 130 is lost. In contrast, if the 180 degree phase shifted clock was used instead to switch the multiplexer 418, then a glitch may occur if the clock switch occurred while the generated clock output was rising or 1/positive at the time the host reference clock was falling or 0/negative. For example, if a 180 phase shifted clock signal at a 1/high value triggers the latch 450 to switch the multiplexer 418 at a time that the host reference clock 130 is 0/negative, the output clock 302 would jump from 0/negative to 1/positive in an instant, causing a glitch. In contrast, with the 90 degree phase shift, there is no jump from 1/positive to 1/positive, so no glitch would be apparent. Thus, by using multiple relaxation circuits 410, the oscillator circuit 402 may align its generated clock timing with the host reference clock timing in the event the host reference clock 130 is lost.

In an example operation of the oscillator circuit 402, the host reference clock 130 is passed through delay buffer 422, resulting in a delayed reference clock signal 454 that is in turn is passed to the multiplexer 418. The multiplexer select signal 420 is originally 0/low value, since the latch 450 is initially not set and the output of the latch 450 is low (ground) every reference clock cycle. Thus, the delayed reference clock signal 454 is passed through the multiplexer 418 as multiplexer output signal 456 (CLK$_{FB}$), which signal is then output as the output clock 302 (CLK$_{out}$) from an OR gate 458 since reference sense signal 414 is low during this time. The host reference clock 130 may thus be output beginning at the time of its rising edge (0 degree phase) while also being passed to the relaxation circuits 410 to obtain the generated clock 406. Next, to pass the generated clock 406 as the output clock 302 while the host reference clock is present (in which case reference clock loss signal 446, reference sense signal 414, and oscillator mode signal 448 are all 0/low value), a positive edge detector such as AND gate 452 with a delay inverter 460, may receive the 90 degree, phase shifted reference clock (CLK$_{OUT}$90) while host reference clock 130 is rising or positive, and thus output a 1/high value at a positive edge of the 90 degree shifted clock. In turn, OR gate 462 will output a 1/high value that sets the latch 450. This results in a 1/high value output that is sent to another AND gate 464, and since reference sense signal 414 is 0, the multiplexer select signal 420 output will be 1/high and switch the multiplexer 418 to pass the generated clock 406 instead of the host reference clock 130 from 90 degrees onward to the output clock 302. The generated clock 406 may be output until the next positive edge of the host reference clock 130 (or at 360 degree phase with respect to the reference clock), which again triggers the latch 450 to output a 0/low value which in turn causes the multiplexer select signal 420 output to again be 0/low and switch the multiplexer 418 back to pass the host reference clock 130 as the output clock 302.

This process will repeat until the host reference clock 130 is lost, in which case the reference clock loss signal 446 will be set (as described below with respect to FIG. 4C) and remain 1/high and thus fix multiplexer select signal 420 to 1/high so that the generated clock 406 may continue to be output each generated clock cycle. Once the host reference clock 130 returns, reference clock loss signal 446 will return to 0/low, causing the latch 450 to exit out of set mode and again output a 0/low value in response to the positive edge of CK$_{REF}$ to result in multiplexer select signal 420 value being 0/low and the host reference clock 130 passing through the multiplexer 418. However, the reference sense signal 414 will also be set 1/high for a plurality of clock cycles (in this example, two cycles), causing the OR gate 458 to result in CLK$_{out}$ being set to 1/high (instead of to the reference clock value now at CLK$_{FB}$). This serves to prevent glitches in multiplexer output signal 456 from being output during the transition of the oscillator circuit 402 back to its previous state. Afterwards, reference sense signal 414 will be set back to 0/low, and the above process may repeat where output clock 302 reflects the value of the host reference clock 130 or generated clock 406 at different phases of the host reference clock 130 as previously described.

Referring now to FIG. 4C, an example is provided of a circuit 412 configured to indicate loss of host reference clock 130 when the host stops sending data to the storage device 102 and to indicate availability of the host reference clock 130 when the host again sends data to the storage device 102. The circuit 412 may also configure the clock selection circuit 408 to change the input of the multiplexer 418 to select either the host reference clock 130 or generated clock 406 for output as output clock 302. The circuit 412 is configured with a plurality of latches (multiple D flipflops with set input and a D flipflop with reset input) including a latch 466 (e.g., a D flipflop with reset input) which is configured to generate reference clock loss signal 446 (REF$_{LOSS}$), and latches 468, 470 (e.g., D flipflops with set inputs and a D flipflop with reset input) which are configured to control generation of reference sense signal 414 (REF$_{SENSE}$). When the host reference clock is lost, latches 470 are placed in set and reset states respectively in response to an output of latches 468 triggered by the circuit 412 indicating loss of the host reference clock 130. In this example, latches 470 include two set D flops and 1 reset D flop. As a result, the output of these three flip flops when set and reset respectively would be 110, with the reference sense signal 414 output being 0 while the host reference clock 130 is lost. When the reference clock again becomes available and triggers the latches 470 to no longer be in a set or reset state, the outputs would shift right and result in the reference sense signal 414 output being 1 for two clock cycles before the latch outputs become all low values (e.g., the outputs would shift right each clock cycle to be 110->011->001->000). Thus the reference sense signal 414 may be high for two clock cycles when the host reference clock 130 is re-detected following its loss. This arrangement serves to address frequency glitches that may occur in the transition from outputting the generated clock 406 to outputting the host reference clock 130 as output clock 302.

During an example operation, initially while the host reference clock 130 is present, the reference sense signal 414

(REF$_{SENSE}$) will be 0 so latch 466 will it be out of reset state. Moreover, multiplexer select signal 420 (MUX$_{SEL}$) is initially 0 to allow the host reference clock 130 to pass through the multiplexer 418 and be output from the oscillator circuit 402. Thus, every host reference clock cycle reflected at the multiplexer output signal 456 (CLK$_{FB}$) triggers an output (Q) of zero from the latch 466, and so reference clock loss signal 446 (REF$_{LOSS}$) will be 0 while host reference clock 130 is present. When the reference clock is lost, multiplexer select signal 420 will be driven to 1 and therefore result in reference clock loss signal 446 being 1 following a rising edge of the generated clock 406 at CLK$_{FB}$. An AND gate 472 and delay inverter 474 will result in a high output at the time reference clock loss signal 446 changes from 0 to 1 (its rising edge occurs), resulting in the latches 468 entering a set state and thus their outputs (Qs) being 1. The output of the last (rightmost) one of latches 468 in turn will result in latches 470 entering a set and reset state respectively and reference sense signal 414 being 0. At this time, notwithstanding the output of the AND gate 472 returning to 0 following the rising edge of the reference clock loss signal 446, the latches 468 will respectively remain with their previously set output since the host reference clock 130 is not available and thus these latches 468 will not be clocked by the delayed reference clock signal 454 (REF$_{DEL}$) during this time. Therefore, when the host reference clock is not available, the latches 470 will remain in their set and reset states and maintain a reference sense signal 414 output continuously of 0 while the reference clock loss signal 446 remains continuously 1. Since the reference clock loss signal 446 remains continuously 1, multiplexer select signal 420 will remain 1 and the generated clock 406 will pass through the multiplexer 418 as multiplexer output signal 456 (CLK$_{FB}$). Since the reference sense signal 414 remains continuously 0, multiplexer output signal 456 will be passed directly through OR gate 458 as the output clock 302 (CLK$_{OUT}$), and thus the oscillator circuit 402 outputs the generated clock signal while the reference clock is missing.

Once the host 104 sends the host reference clock 130 signal again to the storage device 102, the delayed reference clock signal 454 (REF$_{DEL}$) input to latches 468 will return. As a result, since latches 468 are no longer in a set state following the indication of a 1/high value in reference clock loss signal 446, the delayed reference clock signal 454 triggers the input of latches 468 (ground or 0) to shift right a number of clock cycles (four cycles in this example) until a 0 at the output (Q) of the last (rightmost) latch causes the latches 470 to exit from their set and reset states. In this example, since the number of latches 468 is four, the output at the last latch will be 0 following a four clock cycle shift, while in other examples, the value may shift by a different number if a different number of latches 468 are configured. Then as described before, the input of latches 470 (ground or 0) will be shifted right each time a rising edge of multiplexer output signal 456 (CLK$_{FB}$) corresponding to the host reference clock 130 occurs, resulting in the reference sense signal 414 (REF$_{SENSE}$) being high for two clock cycles. For instance, the Q values of latches 470 will initially be 110, followed by 011, followed by 001, and then continuously thereafter by 000, so that reference sense signal 414 will be high for two clock cycles (when the Q values are 011 and 001).

Referring back again to FIG. 4A, during the time reference sense signal 414 is high, latch 466 in FIG. 4C will be reset resulting in the reference clock loss signal 446 being 0. As a result, latch 450 in FIG. 4A will exit the set state, allowing the input of latch 450 (ground or 0) to pass through to the output (Q) and result in multiplexer select signal 420 being 0 at the next reference clock cycle. In the meanwhile, since reference sense signal 414 is high, the output of the AND gate 464 will forcefully set the multiplexer select signal 420 to 0 while the output of the OR gate 458 will forcefully drive output clock 302 to 1. Thus while the host reference clock 130 passes through multiplexer 418 into the clock generation circuit 404 and the generated clock 406 adjusts or calibrates to align with that of the host reference clock 130 and overcome any initial phase alignment errors, the output clock 302 will remain high to prevent any clock transition glitches from being visible at CLK$_{OUT}$. Following the two clock cycles where reference sense signal 414 is high, reference sense signal 414 will return to 0 as previously described, allowing the host reference clock 130 reflected at multiplexer output signal 456 (CLK$_{FB}$) to pass through to CLK$_{OUT}$. As a result, the oscillator circuit 402 may provide output clock 302 as previously described, where the positive edge of the output clock 302 is aligned in time with the host reference clock 130, while the negative edge of the output clock 302 is aligned in time with the generated clock 406.

Additionally, as illustrated in FIG. 4C, oscillator mode signal 448 may be an input to an AND gate 476 which outputs the reference sense signal 414. Generally, the oscillator mode signal 448 is set as 0 during operation of the oscillator circuit 402, resulting in the corresponding input of the AND gate 476 being 1 (due to the input inverter at the AND gate). Thus, the latch 470 output which is input to AND gate 476 ends up controlling the value of REF$_{SENSE}$. However, the controller 123 may change the oscillator mode signal 448 to 1 if the controller determines to trim the relaxation circuits 410 using the data trim bus 432 (S$_{TRIM}$), or if the controller determines to maintain the oscillator circuit 402 in a state simulating a relaxation oscillator in which only the generated clock 406 is output regardless of whether the host reference clock 130 is available or not. In such case, the reference sense signal 414 will be fixed at 0 regardless of whether the host reference clock 130 is available or not, and the output of the OR gate 462 in FIG. 4A will be fixed at 1 resulting in MUX$_{SEL}$ being fixed at 1. As a result, the clock generation circuit 404 will be configured to simulate a relaxation oscillator outputting the generated clock 406 only.

Figure 5:
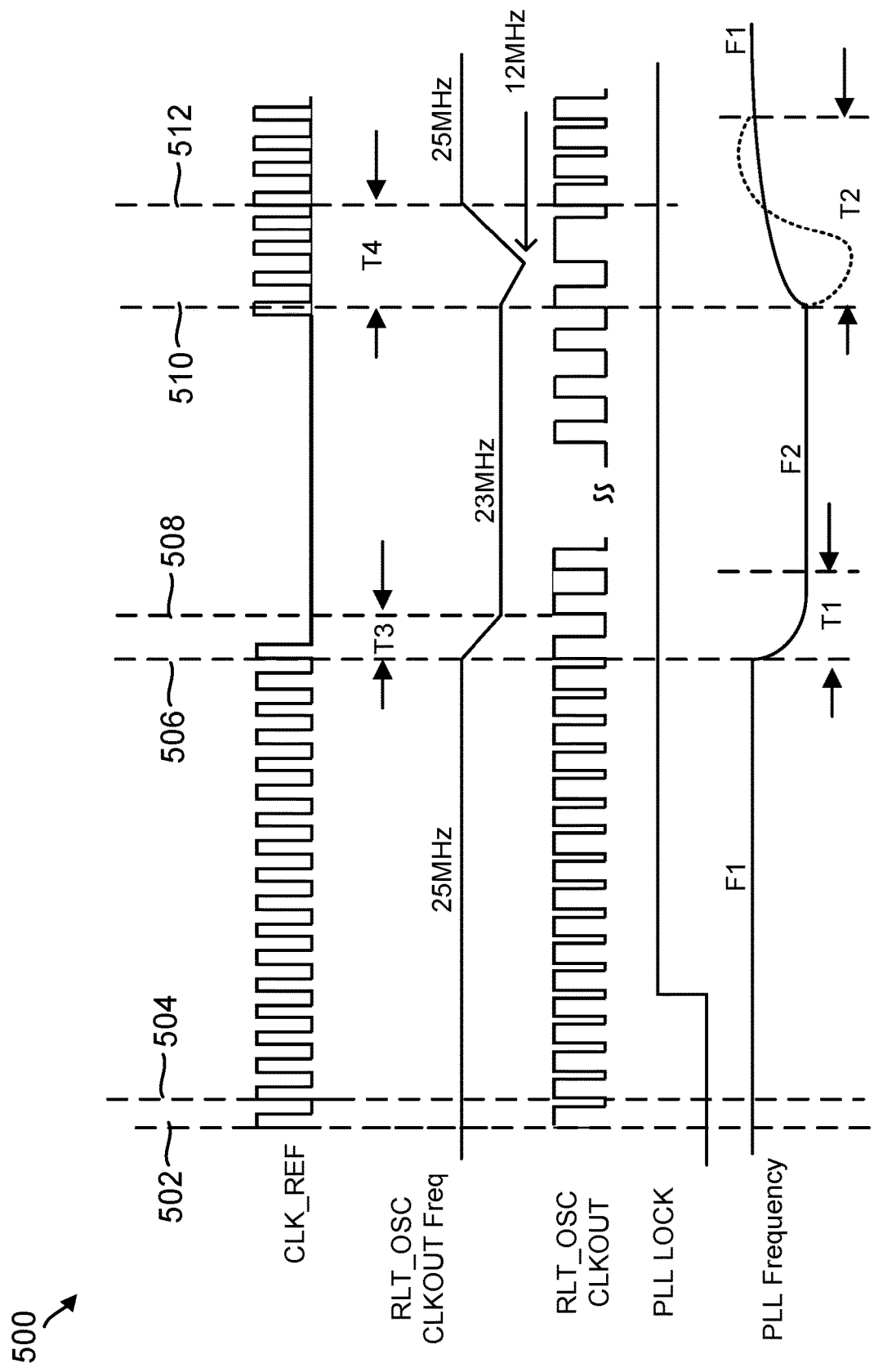
FIG. 5 is a conceptual diagram illustrating an example of voltage levels over time of input and output signals for an RLT oscillator in the storage device of FIG. 1.

FIG. 5 illustrates an example 500 of a timing diagram illustrating the voltage levels of the input (the host reference clock 130) and output (the output clock 302) of the RLT oscillator 128 (the oscillation circuit 402). In this example, host reference clock 130 (CLK_REF) is input to the oscillator circuit with a frequency of 25 MHZ, while the oscillator generated clock has a frequency of 23 MHz in this example. At a positive/rising edge of the host reference clock 130, or between the 0 and 90 degree phases of the host reference clock, the host reference clock 130 is passed directly as the output clock 302 through the multiplexer 418. Thus the output clock 302 (RLT_OSC CLKOUT) signal's positive edge is aligned in time with respect to the host reference clock's positive edge at time 502 (including any negligible delay between the timing of the positive edges of the host reference clock 130 and the output clock 302). While the host reference clock 130 signal is positive, the 90 degree phase of the host reference clock 130 (CLK$_{OUT}$90) triggers the multiplexer 418 to select the generated clock 406 for the output clock 302. Therefore the negative edge or output of RLT_OSC CLKOUT reflects the timing of the generated clock 406 rather than the timing of the host reference clock 130. This point is illustrated in FIG. 5, where the pulse width or duty cycle of the output clock 302 is shown being larger than that of the host reference clock 130. This duty cycle difference is due to the positive/rising edge of output clock 302 being aligned with the 25 MHz host reference clock, while the negative edge of the output clock 302 is aligned with the 23 MHz generated clock. Thus, the negative edge of the generated clock 406 may be output as illustrated. However, by the next positive edge of the host reference clock 130, the multiplexer 418 again passes the host reference clock 130 through as the output clock 302, and thus the positive edge of the output clock 302 will again be aligned with the positive edge of the host reference clock 130 at time 504.

While the host reference clock 130 remains available, this clock transition in the output clock 302 may repeat as illustrated, with the positive edges of the output clock 302 being aligned with those of the host reference clock 130 and the negative edges of the output clock 302 being aligned with respect to those of the generated clock 406. Although the output clock 302 includes a difference in duty cycle with respect to the host reference clock 130, the duty cycle differences may be disregarded when the output clock 302 is passed to the frequency multiplier 304 or PLL. For example, after the output clock 302 ($CK_{REF\_FM}$) is passed to the frequency multiplier 304 in FIG. 3, the PLL will lock its PLL clock to match the phase of the output clock 302 based on its frequency and timing of its positive edges and irrespective of its duty cycle timing. In particular, after a number of host reference clock cycles, the frequency F1 of the PLL clock may be locked in phase with the 25 MHz output clock frequency, and thus the PLL may change its value of its output, PLL lock signal from 0 to 1. A PLL lock signal indicates a quality or status of the PLL clock, and so a 1/high PLL lock signal indicates that the PLL clock has a proper frequency and duty cycle that may be systematically used by the various components of the storage device 102. Since the reduced frequency F2 of the 23 MHz generated clock is a small reduction compared to frequency F1, the PLL lock may remain 1 even when the PLL frequency adjusts during time period T1 between frequencies when the host reference clock is lost and again during time period T2 after the host reference clock again becomes available.

Eventually, the host reference clock 130 may become lost, for example when the host ceases to send data to the front end of the storage device, and thus a last rising edge of the host reference clock 130 will be reflected in the output clock 302 as illustrated at time 506. Following this positive edge, the negative edge of the output clock 302 will be taken from the generated clock 406 as previously described, but since another positive edge of the host reference clock 130 will not follow, the next positive edge of the generated clock 406 is output instead in output clock 302. Thus, the frequency of the output clock will show a reduction from the 25 MHz frequency of the reference clock to the 23 MHz frequency of the generated clock. This transition may occur immediately or without time delay, that is, at time 508 following one generated clock cycle (represented by time period T3) as illustrated. Following output of the positive edge of the generated clock 406 in the output clock 302 at time 508, the generated clock 406 will continue to be output in a feedback loop (including both its falling and rising edges) as long as the host reference clock 130 remains lost. During this time, as a result of the brief clock transition in output clock 302, the PLL clock frequency will reduce to and smoothly settle at the generated clock frequency F2, at which frequency it will remain until the host reference clock 130 returns. Thus, the frequency of the PLL clock will remain locked to its reference frequency, in this case the 23 MHz frequency of the generated clock, and the output clock 302 will continue to remain at this 23 MHz frequency while the host reference clock 130 remains missing. With this smooth PLL clock transition, pending data transfer at the storage device 102 may continue at the lower frequency without any glitch resulting from the host reference clock being lost.

In this example, the frequency of 23 MHz reflects an 8% reduction in frequency from the host reference clock frequency of 25 MHz, based on trim parameters that the controller applies to the relaxation circuits 410 to compensate for VT variations in clock frequency. In other examples, different trim parameters may be applied to the data trim bus 432 to result in other frequency reductions than 8%, so long as they are at most slightly lower than the host clock frequency (e.g., 0-8%). For instance, different values of bits may be applied to the data trim bus 432 to adjust the IDAC current source coupled to each capacitor 424, 426, which may in turn adjust the charging and discharging rate of the capacitors and thus the clock output frequency by a controlled amount. The limitation on trimming or frequency reduction here (e.g., 0-8%) is to prevent the rising edge of the generated clock 406 from occurring earlier in time than the rising edge of the host reference clock 130, since that would result in a glitched clock output. For instance, if F2 deviated from F1 by too large a reduction amount, then the pulse width of the output clock 302 would be larger than the next rising edge of the reference clock (e.g., larger than the time difference between times 502 and 504) and would thus effectively result in the output clock always being high. The maximum amount of trimming that may be applied also accounts for VT changes. For instance, if the generated clock 406 has a +−4% frequency variation that may occur due to VT changes, the controller 123 may be configured to trim the frequency by no more than 4% to 24 MHz, since certain voltages or temperatures may cause the trimmed frequency to be further reduced down by a maximum of 8% to 23 MHz (the illustrated example). Thus, by limiting the maximum amount of frequency reduction that may occur in response to trimming the relaxation circuits 410 such that the pulse width of the output clock is less than the time difference between times 502 and 504, the controller 123 may avoid the oscillator circuit 402 producing a glitchy output clock.

When the host reference clock 130 has returned, for example when the host is sending new data to the storage device 102, the storage device may continue to output the generated clock 406 at the reduced frequency for a number of reference clock cycles depending on the number of latches 468 in the circuit 412 of FIG. 4C. For example, beginning at time 510, the generated clock 406 may continue to be output in output clock 302 at 23 MHz for one clock cycle in the example where one D flipflop is configured for the latches 468 as illustrated in FIG. 5, or for four clock cycles in the example where four D flipflops are configured for the latches 468 as illustrated in FIG. 4C. Afterwards, the oscillator circuit 402 adjusts itself back into its original condition of providing output clock 302 at the host reference clock frequency. However, to prevent the output clock from showing/outputting a glitch or frequency error during the transition back from the generated clock 406 to the host reference clock 130, the reference sense signal 414 is set for a number of host reference clock cycles (and thus the output clock 302 is driven high for this number of clock cycles) depending on the number of latches 470 in the circuit 412 of FIG. 4C. For example, the output clock 302 may continue to be driven high for two clock cycles in the example where two set D flipflops are configured for the latches 470 illustrated in FIG. 4C. During these two host reference clock cycles, the host reference clock 130 is fed through the multiplexer 418 to become the multiplexer output signal 456 (although the signal is not output in output clock 302 due to reference sense signal 414 being high), and the multiplexer output signal 456 is again passed through the clock generation circuit 404 to result in the generated clock 406. While this adjustment is occurring during the two 25 MHz reference clock cycles, the output clock 302 effectively has a fraction of the frequency of the reference clock (in this case, 12 MHz, since reference sense signal 414 is driven high for two clock cycles and thus CLKOUT is high these two cycles). Afterwards, beginning at time 512, the output clock behavior returns to its earlier state as illustrated, in which the positive/rising edge of the output clock 302 is reflected by the positive/rising edge of the host reference clock 130, while the negative/falling edge of the output clock 302 is reflected by the negative/falling edge of the generated clock 406 (at the 25 MHZ host reference clock frequency). Thus, as illustrated in FIG. 5, at least three generated clock cycles may occur between times 510 and 512 (e.g., two cycles due to latches 470 and at least one more cycle due to latches 468) before the output clock 302 reverts to its earlier state when the host reference clock 130 is again present (represented by time period T4).

Figure 6:
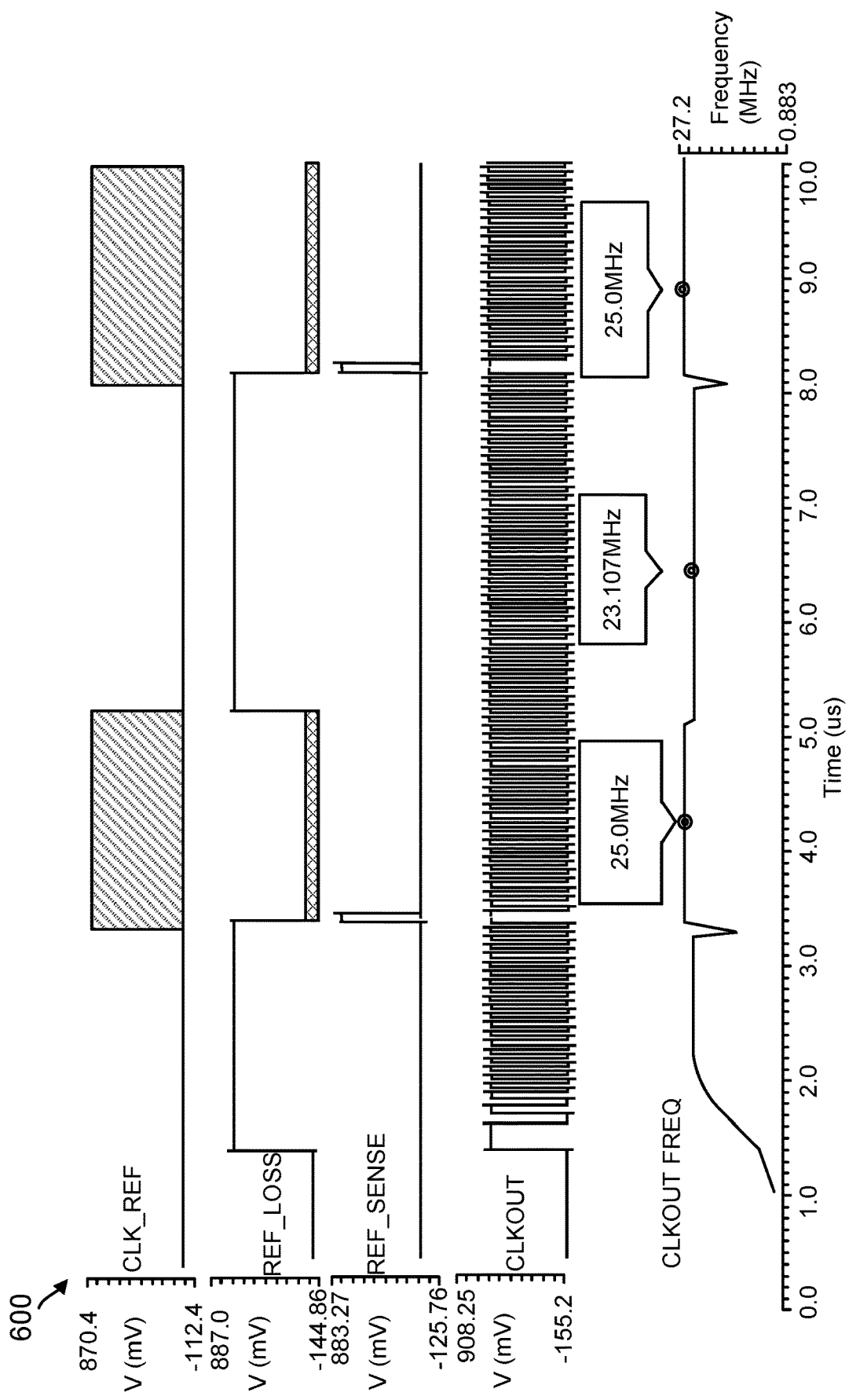
FIG. 6 is a conceptual diagram illustrating an example of voltage levels over time of various signals for an RLT oscillator in the storage device of FIG. 1.

FIG. 6 illustrates an example 600 of another timing diagram illustrating the voltage levels of the input (the host reference clock 130) and output (the output clock 302) of the RLT oscillator 128 (the oscillation circuit 402). Initially, before the host reference clock 130 (CLK_REF) first arrives at the storage device 102, the oscillator circuit 402 begins generating its clock 406 at its configured frequency through a feedback loop (e.g., the clock generation circuit 404). The reference clock loss signal 446 (REF_LOSS) will also set to 1 (since the host reference clock 130 is not yet available), and the generated clock 406 will be output at the 23 MHz frequency (CLKOUT FREQ) within one generated clock cycle in output clock 302 (CLKOUT). Similarly, when the host reference clock 130 is available but then stops arriving or is lost, the reference clock loss signal 446 (REF_LOSS) becomes and remains high, and the generated clock 406 will be output following one clock cycle at the 23 MHz frequency (CLKOUT FREQ). When the host reference clock 130 becomes available (either initially or upon its return), the reference clock loss signal 446 (REF_LOSS) reduces to low and the reference sense signal 414 (REF_SENSE) becomes high for two clock cycles. As a result, upon detection of the positive edge of the reference clock signal at latch 450, the host reference clock 130 will pass through the multiplexer 418, but since during the two clock cycles the reference sense signal 414 is high, the output clock 302 will be set to 1 during this short time. This results in CLKOUT FREQ dropping effectively by half of 25 MHz to 12 MHz for one reference clock cycle while REF_SENSE is high as illustrated in FIG. 6. Once reference sense signal 414 (REF_SENSE) goes back low following these two clock cycles, the output clock 302 will be output at the host reference clock frequency or a division factor of this frequency (CLKOUT FREQ). For instance, if the host reference clock frequency is 100 MHz, CLKOUT may settle at 25 MHZ (a division factor of 4). When this output clock 302 is passed to the frequency multiplier (e.g., the PLL), the output clock may be increased to the hundreds of MHz or GHz range (e.g., to 1 GHZ) before being sent to the various components of the storage device 102.

Thus, the oscillator circuit of the storage device in the present disclosure may realize various advantages. In one aspect, when the host reference clock is present, the output of the oscillator circuit is taken from the reference clock itself instead of a generated clock corrected to match the reference clock in a feedback loop. Thus, the positive edge of the reference clock may be output without additional timing penalty while the reference clock is present, including at different supply voltages or temperatures. In another aspect, when the reference clock is lost, no overshoot in the PLL output clock frequency may occur, thereby causing no additional area overhead to occur in closing SoC timing paths at higher frequencies than a target clock frequency. In a further aspect, storage device costs may be saved since crystal oscillators may be omitted from the storage device. In an additional aspect, die package and PCB designs may be simplified since the significant space utilization and stringent routing constraints warranted by crystal oscillators may be avoided.

Figure 7:
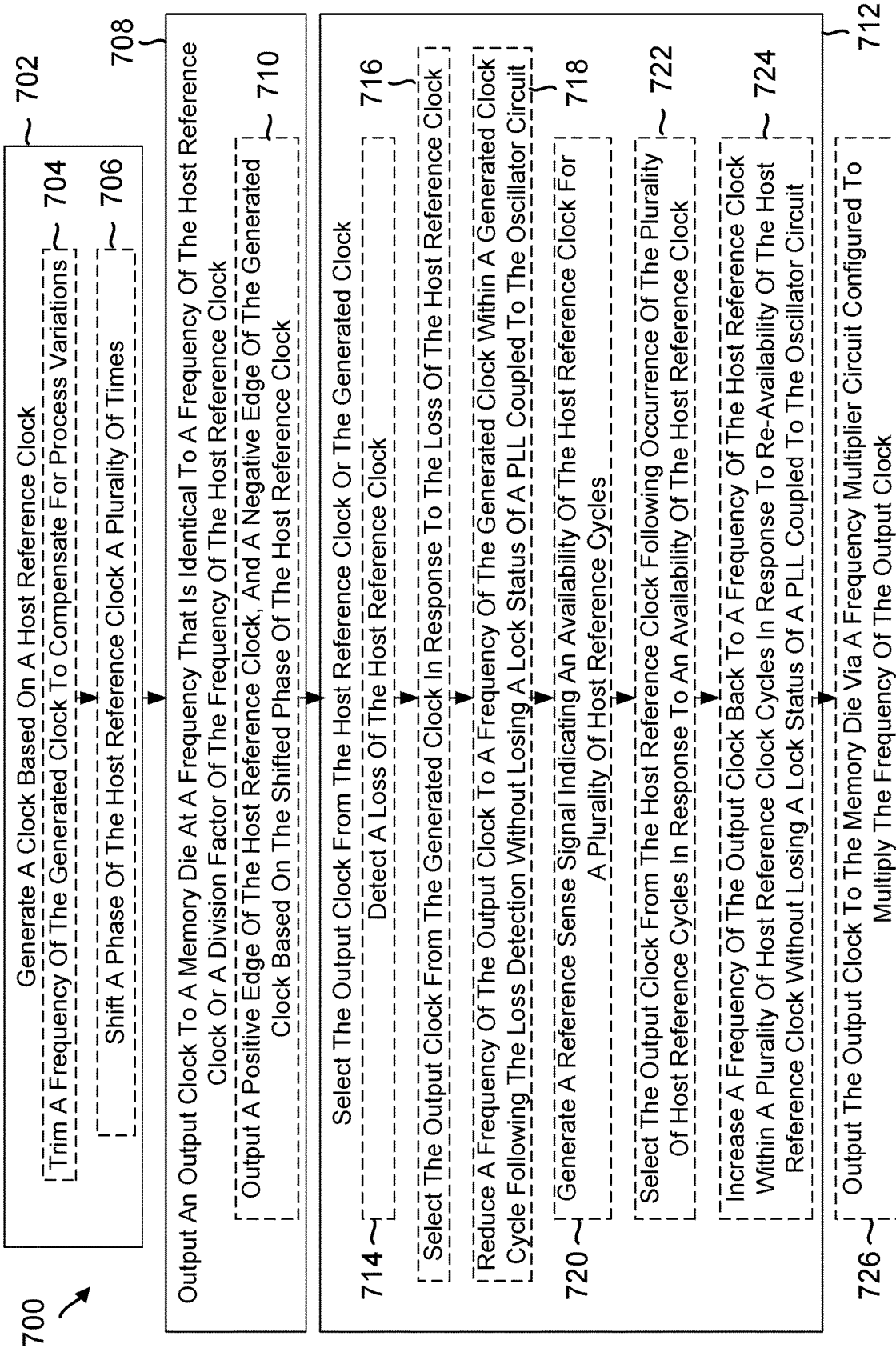
FIG. 7 is a flow chart illustrating an example of a method for producing an oscillator clock from a host reference clock in a storage device lacking a crystal oscillator, as performed by the storage device of FIG. 1.

FIG. 7 illustrates an example flow chart 700 of a method for producing an oscillator clock from a host reference clock in a storage device lacking a crystal oscillator. For example, the method can be carried out in a storage device 102 such as the one illustrated in FIG. 1. Each of the steps in the flow chart can be controlled using the controller as described below (e.g. controller 123), by a component or module of the controller or storage device 102 (e.g., RLT oscillator 128, oscillator circuit 402), or by some other suitable means.

As represented by block 702, the oscillator circuit generates a clock (e.g., generated clock 406) based on a host reference clock (e.g., host reference clock 130). To generate the clock at block 702, for instance, as represented by block 704, the oscillator circuit trims the generated clock at a lower frequency than a frequency of the host reference clock to compensate for process variations (e.g., using data trim bus 432 coupled to relaxation circuit 410). Moreover, as represented by block 706, the oscillator circuit shifts a phase of the host reference clock a plurality of times (e.g., using multiple relaxation circuits 410).

As represented by block 708, the oscillator circuit outputs an output clock (e.g., output clock 302) to a memory die (e.g., directly or indirectly to die 114 in NVM 110, 201) at a frequency that is identical to a frequency of the host reference clock (e.g., 100 MHz in one example) or a division factor of the frequency of the host reference clock (e.g., 25 MHz in one example). For instance, as represented by block 710, the oscillator circuit outputs a positive edge of the host reference clock (e.g., rising edge at time 502), and outputs a negative edge of the generated clock (e.g., falling edge between times 502, 504) based on the shifted phase of the host reference clock (e.g., $CLK_{OUT}90$ controls $MUX_{SEL}$ to switch the circuit to output the generated clock).

During a time period in which the host reference clock is available (e.g., until after time 506 in FIG. 5), a positive (rising) edge of the output clock is aligned in time with a positive (rising) edge of the host reference clock (e.g., as illustrated at time 502 of FIG. 5), and a negative (falling) edge of the output clock is aligned in time with a negative (falling) edge of the generated clock (e.g., between times 502, 504) during a respective clock cycle of the host reference clock. Moreover, during a time period in which the host reference clock is lost (e.g., between times 508, 510), a positive (rising) edge of the output clock is aligned in time with a positive (rising) edge of the generated clock within a generated clock cycle following the loss of the host reference clock (e.g., following time period T3).

As represented by block 712, the oscillator circuit selects the output clock from the host reference clock or the generated clock (e.g., using multiplexer 418 in response to the value of MUX$_{SEL}$). For instance, as represented by block 714, the oscillator circuit detects a loss of the host reference clock (e.g., using circuit 412 as indicated by REFLoss going high or 1). As represented by block 716, the oscillator circuit may select the output clock from the generated clock in response to the loss of the host reference clock (e.g., MUX$_{SEL}$ may become 1 in response to REF$_{LOSS}$ becoming 1). As represented by block 718, the oscillator circuit may reduce a frequency of the output clock (e.g., F1 in FIG. 5) to a frequency of the generated clock (e.g., F2 in FIG. 5) within a generated clock cycle (e.g., one cycle for time period T3) following the loss detection without losing a lock status of a PLL coupled to the oscillator circuit (e.g., PLL LOCK remains high). As represented by block 720, the oscillator circuit may generate a reference sense signal indicating an availability of the host reference clock for a plurality of host reference cycles (e.g., using circuit 412 and as illustrated in FIG. 6 by REF_SENSE going high for two host reference clock cycles). As represented by block 722, the oscillator circuit may select the positive edge of the output clock from the host reference clock following occurrence of the plurality of host reference cycles in response to an availability of the host reference clock (e.g., MUX$_{SEL}$ may become low/0 in response to REF$_{SENSE}$ becoming 1/high). As represented by block 724, the oscillator circuit may increase a frequency of the output clock (e.g., F2 in FIG. 5) back to a frequency of the host reference clock (e.g., F1 in FIG. 5) within a plurality of host reference clock cycles (e.g., given by time period T4) in response to re-availability of the host reference clock (e.g., as indicated by REF$_{SENSE}$ going high in circuit 412) without losing a lock status of a PLL coupled to the oscillator circuit (e.g., PLL lock remains high).

As represented by block 726, the oscillator circuit may output the output clock to the memory die (e.g., die 114 in NVM 110) via a frequency multiplier circuit configured to multiply the frequency of the output clock (e.g., from a 25 MHz output clock to a 1 GHz output clock for example using frequency multiplier 304, which circuit may be configured according to one of ordinary skill in the art).

Figure 8:
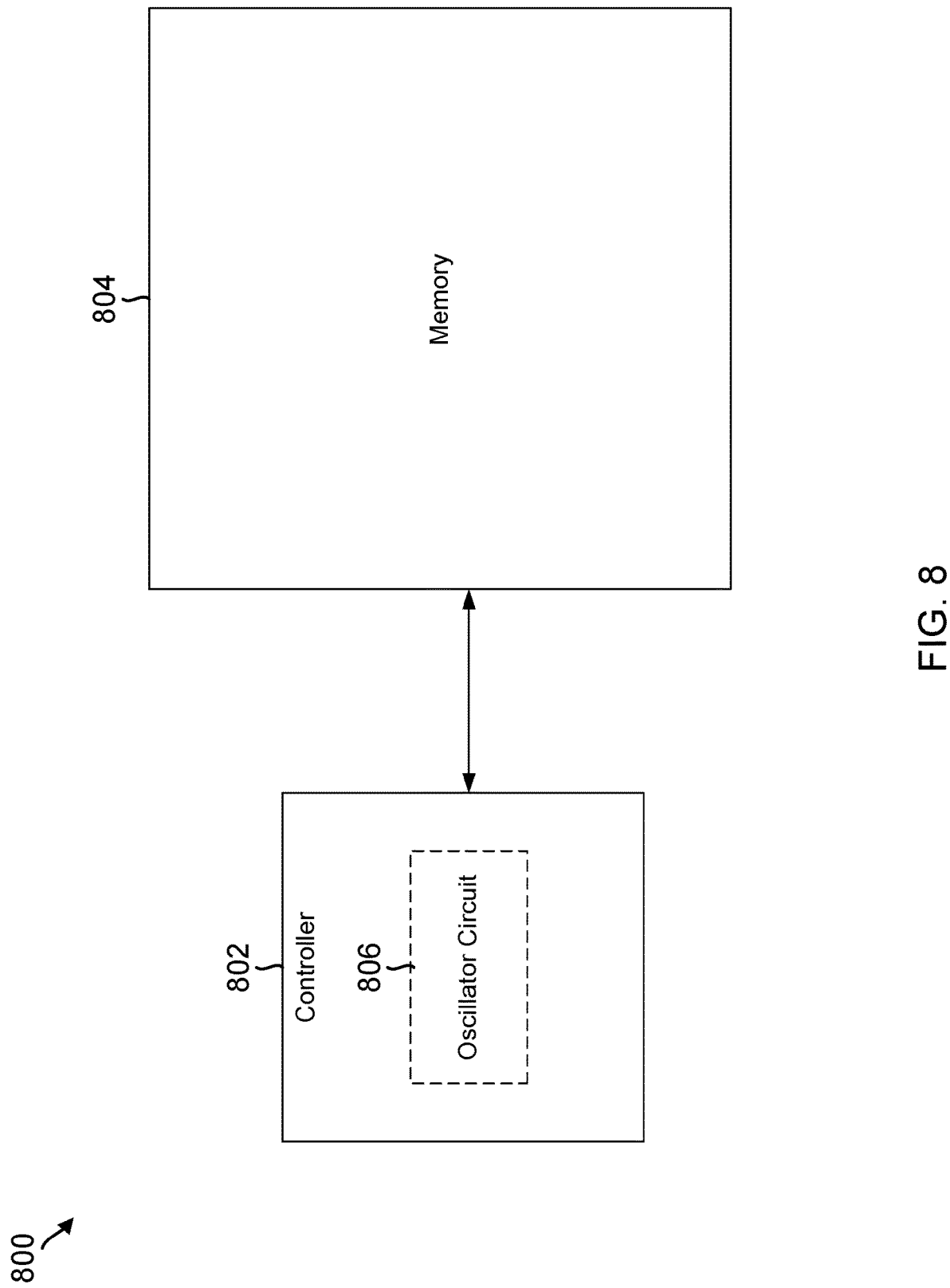
FIG. 8 is a conceptual diagram illustrating an example of a controller that produces an oscillator clock from a host reference clock in the storage device of FIG. 1 lacking a crystal oscillator.

FIG. 8 is a conceptual diagram illustrating an example 800 of a controller 802 coupled to a memory 804 in a storage device. For example, controller 802 may correspond to controller 123, and memory 804 may correspond to the NVM 110, 201 of the storage device 102 in FIG. 1. The controller may be implemented in software, hardware, or a combination of hardware and software. In one exemplary embodiment, the controller is implemented with several software modules executed on one or more processors, but as those skilled in the art will appreciate, the controller may be implemented in different ways. The skilled artisan will readily understand how best to implement the controller based on the particular design parameters of the system.

In one example, the controller 802 includes an oscillator circuit 806 that may provide a means for generating a clock based on a host reference clock, and a means for outputting an output clock to the memory die, where while the host reference clock is available, a positive edge of the output clock is aligned in time with a positive edge of the host reference clock and a negative edge of the output clock is aligned in time with a negative edge of the generated clock during a respective clock cycle of the host reference clock, and in response to loss of the host reference clock, a positive edge of the output clock is aligned in time with a positive edge of the generated clock within a generated clock cycle following the loss. For example, the oscillator circuit 806 may perform the process described above with respect to FIG. 7.

Implementation examples are described in the following numbered clauses:

Clause 1. A storage device, comprising: a memory die; and a controller including an oscillator circuit configured to: generate a clock based on a host reference clock, and output an output clock to the memory die; wherein while the host reference clock is available, the output clock includes a frequency that is identical to a frequency or a division factor of the frequency of the host reference clock, and in response to loss of the host reference clock, the oscillator circuit is configured to reduce the frequency of the output clock to a frequency of the generated clock within a generated clock cycle following the loss of the host reference clock.

Clause 2. The storage device of clause 1, wherein the oscillator circuit is configured to increase the frequency of the output clock back to the frequency of the host reference clock in response to re-availability of the host reference clock following the loss.

Clause 3. The storage device of clause 1 or clause 2, wherein the oscillator circuit is configured to reduce the frequency of the output clock to the frequency of the generated clock without losing a lock status of a phase locked loop (PLL) coupled to the oscillator circuit.

Clause 4. The storage device of any of clauses 1 to 3, wherein the oscillator circuit is configured to output the output clock to the memory die via a frequency multiplier circuit configured to multiply the frequency of the output clock.

Clause 5. The storage device of any of clauses 1 to 4, wherein the oscillator circuit includes a clock generation circuit configured to generate the clock based on the host reference clock, and a clock selection circuit configured to select the output clock from the host reference clock or the generated clock.

Clause 6. The storage device of any of clauses 1 to 5, wherein the oscillator circuit is configured to select the output clock from the generated clock in response to the loss of the host reference clock.

Clause 7. The storage device of any of clauses 1 to 6, wherein the oscillator circuit is configured to select a positive edge of the output clock from the host reference clock in response to an availability of the host reference clock.

Clause 8. The storage device of any of clauses 1 to 7, wherein the oscillator circuit is configured to shift a phase of the host reference clock a plurality of times.

Clause 9. The storage device of any of clauses 1 to 8, wherein the oscillator circuit is configured to detect a loss of the host reference clock.

Clause 10. The storage device of any of clauses 1 to 9, wherein the oscillator circuit is configured to generate a reference sense signal indicating an availability of the host reference clock.

Clause 11. The storage device of any of clauses 1 to 10, wherein during a time period in which the host reference clock is available, a positive edge of the output clock is aligned in time with a positive edge of the host reference clock and a negative edge of the output clock is aligned in time with a negative edge of the generated clock during a respective clock cycle of the host reference clock, and during a time period in which the host reference clock is lost, a positive edge of the output clock is aligned in time with a positive edge of the generated clock within a generated clock cycle following the loss of the host reference clock.

Clause 12. A storage device, comprising: a memory die; and an oscillator circuit configured to: generate a clock based on a host reference clock, and output an output clock to the memory die; wherein while the host reference clock is available, a positive edge of the output clock is aligned in time with a positive edge of the host reference clock and a negative edge of the output clock is aligned in time with a negative edge of the generated clock during a respective clock cycle of the host reference clock, and in response to loss of the host reference clock, a positive edge of the output clock is aligned in time with a positive edge of the generated clock within a generated clock cycle following the loss.

Clause 13. The storage device of clause 12, wherein the oscillator circuit is configured to shift a phase of the host reference clock, and to output the negative edge of the generated clock based on the shifted phase.

Clause 14. The storage device of clause 12 or clause 13, wherein the oscillator circuit is configured to trim the generated clock at a lower frequency than a frequency of the host reference clock to compensate for process variations.

Clause 15. The storage device of any of clauses 12 to 14, wherein the oscillator circuit is configured to generate a reference sense signal indicating an availability of the host reference clock for a plurality of host reference cycles, and to select the positive edge of the host reference clock as the output clock following occurrence of the plurality of host reference cycles.

Clause 16. The storage device of any of clauses 12 to 15, wherein the oscillator circuit is configured to detect loss of the host reference clock, and to reduce a frequency of the output clock to a frequency of the generated clock within a generated clock cycle following the detection.

Clause 17. The storage device of any of clauses 12 to 16, wherein the oscillator circuit is configured to increase a frequency of the output clock to the frequency of the host reference clock in response to an availability of the host reference clock without losing a lock status of a phase locked loop (PLL) coupled to the oscillator circuit.

Clause 18. A storage device, comprising: a memory die; and an oscillator circuit configured to: generate a clock based on a host reference clock, and output an output clock to the memory die; wherein while the host reference clock is available, the oscillator circuit is configured to output the output clock at a frequency that is identical to a frequency of the host reference clock or a division factor of the frequency of the host reference clock, in response to loss of the host reference clock, the oscillator circuit is configured to reduce the frequency of the output clock to a frequency of the generated clock within a generated clock cycle following the loss, and in response to re-availability of the host reference clock, the oscillator circuit is configured to increase the frequency of the output clock back to the frequency of the host reference clock within a plurality of host reference clock cycles following the re-availability.

Clause 19. The storage device of clause 18, wherein during a time period in which the host reference clock is available, the oscillator circuit is configured to align a positive edge of the output clock in time with a positive edge of the host reference clock and to align a negative edge of the output clock in time with a negative edge of the generated clock during a respective clock cycle of the host reference clock, and during a time period in which the host reference clock is lost, the oscillator circuit is configured to align a positive edge of the output clock in time with a positive edge of the generated clock within a generated clock cycle following the loss of the host reference clock.

Clause 20. The storage device of any of clauses 1 to 19, wherein the storage device lacks a crystal oscillator.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to all types of storage devices capable of storing data. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) in the United States, or an analogous statute or rule of law in another jurisdiction, unless the element is expressly recited using the phrase "means for" or, in the case of a method claim, the element is recited using the phrase "step for.

What is claimed is:

1. A storage device, comprising:
   a memory die; and
   a controller including an oscillator circuit that comprises a clock generation circuit and a clock selection circuit, configured to:
   generate, via the clock generation circuit, a clock based on a host reference clock,
   select, via the clock selection circuit, an output clock from the host reference clock or the generated clock, and
   output the output clock to the memory die;
   wherein while the host reference clock is available, the output clock includes a frequency that is identical to a frequency or a division factor of the frequency of the host reference clock, and in response to loss of the host reference clock, the oscillator circuit is configured to reduce the frequency of the output clock to a frequency of the generated clock within a generated clock cycle following the loss of the host reference clock.

2. The storage device of claim 1, wherein the oscillator circuit is configured to increase the frequency of the output clock back to the frequency of the host reference clock in response to re-availability of the host reference clock following the loss.

3. The storage device of claim 1, wherein the oscillator circuit is configured to reduce the frequency of the output clock to the frequency of the generated clock without losing a lock status of a phase locked loop (PLL) coupled to the oscillator circuit.

4. The storage device of claim 1, wherein the oscillator circuit is configured to output the output clock to the memory die via a frequency multiplier circuit configured to multiply the frequency of the output clock.

5. The storage device of claim 1, wherein the oscillator circuit is configured to select the output clock from the generated clock in response to the loss of the host reference clock.

6. The storage device of claim 1, wherein the oscillator circuit is configured to select a positive edge of the output clock from the host reference clock in response to an availability of the host reference clock.

7. The storage device of claim 1, wherein the oscillator circuit is configured to shift a phase of the host reference clock a plurality of times.

8. The storage device of claim 1, wherein the oscillator circuit is configured to detect a loss of the host reference clock.

9. The storage device of claim 1, wherein the oscillator circuit is configured to generate a reference sense signal indicating an availability of the host reference clock.

10. The storage device of claim 1, wherein:
during a time period in which the host reference clock is available, a positive edge of the output clock is aligned in time with a positive edge of the host reference clock and a negative edge of the output clock is aligned in time with a negative edge of the generated clock during a respective clock cycle of the host reference clock, and
during a time period in which the host reference clock is lost, a positive edge of the output clock is aligned in time with a positive edge of the generated clock within a generated clock cycle following the loss of the host reference clock.

11. A storage device, comprising:
a memory die; and
an oscillator circuit configured to:
generate a clock based on a host reference clock, and
output an output clock to the memory die;
wherein while the host reference clock is available, a positive edge of the output clock is aligned in time with a positive edge of the host reference clock and a negative edge of the output clock is aligned in time with a negative edge of the generated clock during a respective clock cycle of the host reference clock, and in response to loss of the host reference clock, a positive edge of the output clock is aligned in time with a positive edge of the generated clock within a generated clock cycle following the loss.

12. The storage device of claim 11, wherein the oscillator circuit is configured to shift a phase of the host reference clock, and to output the negative edge of the generated clock based on the shifted phase.

13. The storage device of claim 11, wherein the oscillator circuit is configured to trim the generated clock at a lower frequency than a frequency of the host reference clock to compensate for process variations.

14. The storage device of claim 11, wherein the oscillator circuit is configured to generate a reference sense signal indicating an availability of the host reference clock for a plurality of host reference cycles, and to select the positive edge of the host reference clock as the output clock following occurrence of the plurality of host reference cycles.

15. The storage device of claim 11, wherein the oscillator circuit is configured to detect loss of the host reference clock, and to reduce a frequency of the output clock to a frequency of the generated clock within a generated clock cycle following the detection.

16. The storage device of claim 11, wherein the oscillator circuit is configured to increase a frequency of the output clock to the frequency of the host reference clock in response to an availability of the host reference clock without losing a lock status of a phase locked loop (PLL) coupled to the oscillator circuit.

17. A storage device, comprising:
a memory die; and
an oscillator circuit configured to:
generate a clock based on a host reference clock, and
output an output clock to the memory die;
wherein while the host reference clock is available, the oscillator circuit is configured to output the output clock at a frequency that is identical to a frequency of the host reference clock or a division factor of the frequency of the host reference clock,
in response to loss of the host reference clock, the oscillator circuit is configured to reduce the frequency of the output clock to a frequency of the generated clock within a generated clock cycle following the loss, and
in response to re-availability of the host reference clock, the oscillator circuit is configured to increase the frequency of the output clock back to the frequency of the host reference clock within a plurality of host reference clock cycles following the re-availability.

18. The storage device of claim 17, wherein:
during a time period in which the host reference clock is available, the oscillator circuit is configured to align a positive edge of the output clock in time with a positive edge of the host reference clock and to align a negative edge of the output clock in time with a negative edge of the generated clock during a respective clock cycle of the host reference clock, and
during a time period in which the host reference clock is lost, the oscillator circuit is configured to align a positive edge of the output clock in time with a positive edge of the generated clock within a generated clock cycle following the loss of the host reference clock.

19. The storage device of claim 17, wherein the storage device lacks a crystal oscillator.

* * * * *